US006473157B2

(12) United States Patent
Nakahara

(10) Patent No.: US 6,473,157 B2
(45) Date of Patent: *Oct. 29, 2002

(54) METHOD OF MANUFACTURING EXPOSURE APPARATUS AND METHOD FOR EXPOSING A PATTERN ON A MASK ONTO A SUBSTRATE

(75) Inventor: Kanefumi Nakahara, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/120,733

(22) Filed: Jul. 23, 1998

(65) Prior Publication Data

US 2002/0021422 A1 Feb. 21, 2002

Related U.S. Application Data

(60) Continuation-in-part of application No. 08/826,874, filed on Apr. 7, 1997, now abandoned, which is a continuation of application No. 08/445,170, filed on May 19, 1995, now abandoned, application No. 09/120,733, which is a continuation-in-part of application No. 08/984,022, filed on Dec. 3, 1997, which is a continuation of application No. 08/472,723, filed on Jun. 7, 1995, now abandoned, which is a division of application No. 08/012,749, filed on Feb. 3, 1993, now abandoned.

(30) Foreign Application Priority Data

Feb. 7, 1992 (JP) .............................................. 4-22618

May 24, 1994 (JP) .............................................. 6-109515

(51) Int. Cl.$^7$ ........................ G03B 27/42; G03B 27/62; B65G 1/00; B65G 21/02

(52) U.S. Cl. ..................... 355/53; 355/75; 414/331.18; 414/416.03

(58) Field of Search ............................ 355/53, 72, 75, 355/55; 414/416, 331, 744.1

(56) References Cited

U.S. PATENT DOCUMENTS 3,968,885 A * 7/1976 Hassan et al. ................. 214/1
4,529,353 A * 7/1985 Dean et al. ................. 414/225
4,539,695 A * 9/1985 La Fiandra ................. 414/222

(List continued on next page.)

FOREIGN PATENT DOCUMENTS

JP 62-195143 * 8/1987
JP 5278813 * 10/1993

Primary Examiner—Russell Adams
Assistant Examiner—Peter B. Kim
(74) Attorney, Agent, or Firm—Miles & Stockbridge P.C.

(57) ABSTRACT

An exposure method, which exposes a pattern of a mask carried on a mask stage onto a substrate, includes transferring the mask to the mask stage by a transfer device, and moving the transfer device to a position in which it does not hinder an exposure.

41 Claims, 12 Drawing Sheets

U.S. PATENT DOCUMENTS

| | | | | |
|---|---|---|---|---|
| 4,643,629 A | * | 2/1987 | Takahashi et al. | 414/222 |
| 4,695,215 A | * | 9/1987 | Jacoby et al. | 414/225 |
| 4,752,898 A | * | 6/1988 | Koenig | 414/936 |
| 4,758,127 A | * | 7/1988 | Imai et al. | 414/416 |
| 4,760,429 A | * | 7/1988 | O'Connor | 355/77 |
| 4,770,590 A | * | 9/1988 | Hugues et al. | 414/331 |
| 4,778,331 A | * | 10/1988 | Kimata et al. | 414/752 |
| 4,787,800 A | * | 11/1988 | Sone et al. | 414/222 |
| 4,818,169 A | * | 4/1989 | Schram et al. | 414/225 |
| 4,824,309 A | * | 4/1989 | Kakehi et al. | 414/222 |
| 4,907,931 A | * | 3/1990 | Mallory et al. | 414/936 |
| 4,917,556 A | * | 4/1990 | Stark et al. | 414/222 |
| 4,984,953 A | * | 1/1991 | Nakazato et al. | 414/331 |
| 4,985,722 A | * | 1/1991 | Ushijima et al. | 414/225 |
| 4,995,063 A | * | 2/1991 | Enoki et al. | 414/225 |
| 4,999,671 A | * | 3/1991 | Iizuka | 355/97 |
| 5,026,239 A | * | 6/1991 | Chiba et al. | 414/331 |
| 5,059,079 A | * | 10/1991 | Foulke et al. | 901/35 |
| 5,061,144 A | * | 10/1991 | Akimoto et al. | 414/225 |
| 5,102,280 A | * | 4/1992 | Poduje et al. | 414/744.5 |
| 5,135,349 A | * | 8/1992 | Lorenz et al. | 414/937 |
| 5,183,370 A | * | 2/1993 | Cruz | 414/752 |
| 5,217,340 A | * | 6/1993 | Harada et al. | 414/941 |
| 5,301,013 A | * | 4/1994 | Meijer et al. | 414/225 |
| 5,308,222 A | * | 5/1994 | Bacchi et al. | 414/936 |
| 5,364,222 A | * | 11/1994 | Akimoto et al. | 414/416 |
| 5,404,894 A | * | 4/1995 | Shiraiwa | 414/416 |
| 5,405,230 A | * | 4/1995 | Ono et al. | 414/937 |
| 5,464,715 A | * | 11/1995 | Nishi et al. | 430/22 |
| 5,471,279 A | * | 11/1995 | Takizawa | 355/73 |
| 5,498,118 A | * | 3/1996 | Nakahara | 414/416 |
| 5,509,771 A | * | 4/1996 | Hiroki | 414/217 |
| 5,909,030 A | * | 6/1999 | Yoshitake et al. | 355/53 |
| 6,085,125 A | * | 7/2000 | Genov | 414/744.1 |

* cited by examiner

METHOD OF MANUFACTURING EXPOSURE APPARATUS AND METHOD FOR EXPOSING A PATTERN ON A MASK ONTO A SUBSTRATE

CROSS-REFERENCE TO RELATED APPLICATIONS

This application is a continuation-in-art of application Ser. No. 08/826,874 filed Apr. 7, 1997 now abandoned, which is a continuation of application Ser. No. 08/445,170 filed May 19, 1995 now abandoned. This Application is also a continuation-in-part of application Ser. No. 08/984,022 filed Dec. 3, 1997, which is a continuation of application Ser. No. 08/472,723 filed Jun. 7, 1995 (abandoned), which is division of application Ser. No. 08/012,749 filed Feb. 3, 1993 (abandoned). All of the aforementioned prior applications are incorporated herein by reference.

BACKGROUND OF THE INVENTION

1. Field of the Invention

The present invention relates generally to an exposure apparatus and method for manufacturing, e.g., a semiconductor device or liquid crystal display device, and is more particularly concerned with such an apparatus and method utilizing a substrate transfer device applicable to a reticle loader system or the like of the exposure apparatus.

2. Related Background Art

FIG. 7 illustrates a conventional substrate transfer apparatus. A carry by the apparatus shown in FIG. 7 is conducted as follows. The substrate storage part 1 is for storing a plurality of substrate casings 2 for encasing substrates R. A substrate R is stored in each casing. The substrate R is taken out of the substrate casing 2 by means of a carrier arm 3 and delivered to a carrier 4. The carrier 4 incorporates a prealignment mechanism. The substrate R is aligned to assume a predetermined state with respect to a carry target position. The prealignment mechanism consists of, e.g., four openable/closable pawl members. The substrate R is caught by the four pawl members, thereby effecting the prealignment. A fiducial position of the substrate R is determined by impinging surfaces of the four pawl members at that time.

The aligned substrate R is delivered to a load arm 5. Thereafter, the load arm 5 carries the substrate R to a reticle table 7. The substrate R that has completely undergone an exposure is delivered by an unload arm 6 to a carrier 4 from the reticle stage 7. Then, the substrate R is returned to a substrate storage part 1 in procedures reversed to the above-mentioned. With the operations described above, the substrate R is carried between the substrate storage part 1 and the reticle table 7. This type of apparatus is disclosed fully in Japanese Patent Application Laid Open No. 62-195143.

Another practice is that some of a plurality of arms serve as temporary standby locations.

In the prior art discussed above, other sorts of substrates R required in one lot are stored in the substrate storage part 1 while being encased in the substrate casings 2. A position of the substrate R is not fixedly held (fixed) in the substrate casing 2. Exposing involves a step of effecting a prealignment each time (herein, a step through the carrier 4). Consequently, there arises such a problem that a carry route elongates correspondingly, and it is therefore impossible to reduce a substrate replacement cycle time.

Further, in the method where some of the carrier arms serve as the temporary standby locations, if there is a large number of substrates to be repeatedly replaced, the substrates are returned to the aforementioned substrate storage part 1. Another substrate is required to be taken out of the substrate storage part 1 and carried to the temporary standby location. For this reason, a problem is caused, wherein a great number of substrates repeatedly replaceable in a short substrate replacement cycle cannot be obtained.

Moreover, when the same number of carrier arms as that of the substrates R to be replaced are disposed in side by side relationship, the arms need a large space, and the whole apparatus becomes complicated. A moving distance of the carrier arm increases when loading and unloading the substrate R. This results in a decline in throughput of carrying the substrates. Under such circumstances, there exists a problem in which the number of the carrier arms cannot be increased.

SUMMARY OF THE INVENTION

It is an object of the present invention to provide an apparatus and method that are capable of reducing a replacement cycle time with an omission of a prealignment step as well as shortening a carry route for replacement of a substrate.

It is another object of the present invention to provide an apparatus and method that are capable of replacing a plurality of substrates in a short replacement cycle time.

It is still another object of the present invention to provide an apparatus and method that are capable of carrying a substrate with no positional deviation.

According to a first aspect of the invention, there is provided an apparatus having: a substrate storage part for storing substrate casings that encase substrates; and a carrier system for carrying a substrate to a substrate stage from the substrate storage part, the apparatus comprising: a first carrier means for carrying a substrate to a first substrate carry position from the substrate storage part; a temporary storage unit incorporating a holding mechanism for individually adsorptively holding the substrate by vacuum in a predetermined state and provided between the first substrate carry position and the substrate stage; and a second carrier means capable of carrying the substrate to the substrate stage from the first carry position and also carrying the substrate between the temporary storage unit and the substrate stage.

According to a second aspect of the invention, there is provided a substrate carrying apparatus for carrying a substrate to a substrate stage, comprising: a substrate storage part incorporating a holding mechanism for individually adsorptively holding the substrate by vacuum in a predetermined state; and a carrier means, capable of carrying the substrate to the substrate stage from the substrate storage part while adsorptively holding the substrate by vacuum, for carrying the substrate while keeping a position of the substrate on the substrate stage.

According to a third aspect of the invention, there is provided a substrate carrying method of carrying a substrate between a substrate storage part for storing the substrate and a substrate stage for locating the substrate in a predetermined fiducial position, the method comprising: a first step of carrying a substrate to the substrate storage part from the substrate stage; a second step of carrying the substrate to the substrate stage from the substrate storage part; a third step of obtaining an offset quantity on a position of the substrate on the substrate stage from the fiducial position on the basis of the first and second steps; and a fourth step of altering a relative position of the substrate stage to the carrier means in accordance with the offset quantity before the substrate is carried to the substrate stage.

The temporary storage unit is advantageously installed in relatively close proximity to a carry target position separately from the substrate storage part, whereby a carry time can be reduced.

Further, each substrate can be directly adsorptively held in the temporary storage unit. Therefore, the substrate that has been once aligned has no positional deviation. For this reason, the substrate can be carried between the temporary storage unit and the substrate stage without passing through the prealignment step.

In addition, if the storage part incorporates a partial air-conditioning function, a clean storage with no dust can be attained.

According to a fourth aspect of the present invention, there is provided a substrate transfer apparatus comprising a temporary storage device, for temporarily storing the substrate, so supported as to be movable in a direction (Z-direction) intersecting the surface of the substrate stage. The substrate transfer apparatus further comprises a substrate holding unit for adsorptively holding the substrate and a rotary arm device, for rotating this substrate holding unit, including a rotary up-and-down member for rotating this substrate holding unit and moving the substrate holding unit in the direction Intersecting the surface of the substrate stage. The substrate is thereby transferred and received between the temporary storage device and the substrate stage through the rotary arm device.

In this case, the rotary arm device is provided with two substrate holding units for holding the substrate. Desirably, each of these two substrate holding units has a pair of substrate adsorptive members opened and closed along the substrate to be held.

According to a fifth aspect of the present invention, a substrate transfer apparatus comprises a substrate transfer unit for transferring and receiving the substrate with respect to a substrate storage device and a temporary storage device, for temporarily storing the substrate between this substrate transfer unit and the substrate stage, so supported as to be movable in a direction (Z-direction) intersecting the surface of the substrate stage. The substrate transfer apparatus further comprises a rotary arm device including a substrate holding member for adsorptively holding the substrate and a rotary up-and-down member for rotating this substrate holding member and thus moving the substrate holding member in the direction intersecting the surface of the substrate stage. The substrate is thereby transferred and received between the temporary storage device and the substrate stage through the rotary arm device.

In this case, the substrate storage device and the substrate transfer unit are mounted on a first base, while the temporary storage device and the substrate stage are mounted on a second base different from the first base. It is desirable that there be provided a substrate locating unit for locating the substrate when transferring the substrate to the temporary storage device from the substrate transfer unit.

Provided further is a vibration detecting unit for detecting a deviation quantity between the first base and the second base. When the positional deviation quantity detected by this vibration detecting unit exceeds a predetermined allowable value, it is desirable that the transfer of the substrate from the substrate transfer unit to the temporary storage device be stopped.

In the substrate transfer apparatus according to the fourth aspect of the present invention described above, the substrate is transferred and received between the temporary storage device and the substrate stage by use of the rotary arm device. In this instance, a desired substrate is replaced between the temporary storage device and the substrate stage with a rotation of the substrate holding member of the rotary arm device as well as with an up-and-down movement of the temporary storage device. A standby position of the substrate is therefore substantially the same as a position of the temporary storage device. Further, the substrate is replaced by making use of the rotation, and, hence, the transfer path of the substrate is short, with the result that the replacing speed of the substrate is quite high.

Moreover, there are provided two substrate holding members each having a pair of openable/closable substrate adsorptive members. In this case, when the substrate is used inwardly of, e.g., one pair of substrate adsorptive members, the other pair of substrate adsorptive members are set in an opened state. Besides, preparation for taking out the substrate that is to be used next is finished simply by moving the temporary storage device to a take-out position of the next substrate. Accordingly, the time for preparing the substrate employed next is remarkably reduced.

In the substrate transfer apparatus according to the fifth aspect of the present invention, the substrate is transferred and received between the temporary storage device and the substrate stage by use of the rotary arm device, and, therefore, the transfer path of the substrate is short, and the transfer speed of the substrate is high, whereby the speed of replacing the substrate is quite high.

In addition, the substrate storage device and the substrate transfer unit are mounted on the first base, while the temporary storage device and the substrate stage are mounted on the second base different from the first base. Provided also is a substrate locating unit for locating the substrate when transferring the substrate from the substrate transfer unit to the temporary storage device. In this case, the vibrations on the side of the substrate transfer unit are not transmitted to the substrate stage. Moreover, the locating of the substrate is conducted by the substrate locating unit, and hence the prealignment of the substrate on the substrate stage can be omitted.

Provided further is a vibration detecting unit for detecting the deviation quantity between the first base and the second base. When the positional deviation quantity detected by this vibration detecting unit exceeds a predetermined allowable value, the transfer of the substrate from the substrate transfer unit to the temporary storage device is stopped. In this case, the substrate is transferred to the temporary storage device in a state where the deviation quantity from the position located by the substrate locating unit is lessened, and therefore the rough locating can be omitted on the side of the temporary storage device.

Other objects, aspects, and advantages of the present invention will become apparent from the following detailed description of the preferred embodiments in conjunction with the accompanying drawings. For example, it will be seen that another aspect involves an exposure method which exposes a pattern on a mask stage onto a substrate, wherein the mask is transferred to the mask stage by a transfer device, and the transfer device is moved to a position at which it does not hinder an exposure.

DETAILED DESCRIPTION OF THE PREFERRED EMBODIMENTS

Figure 1:
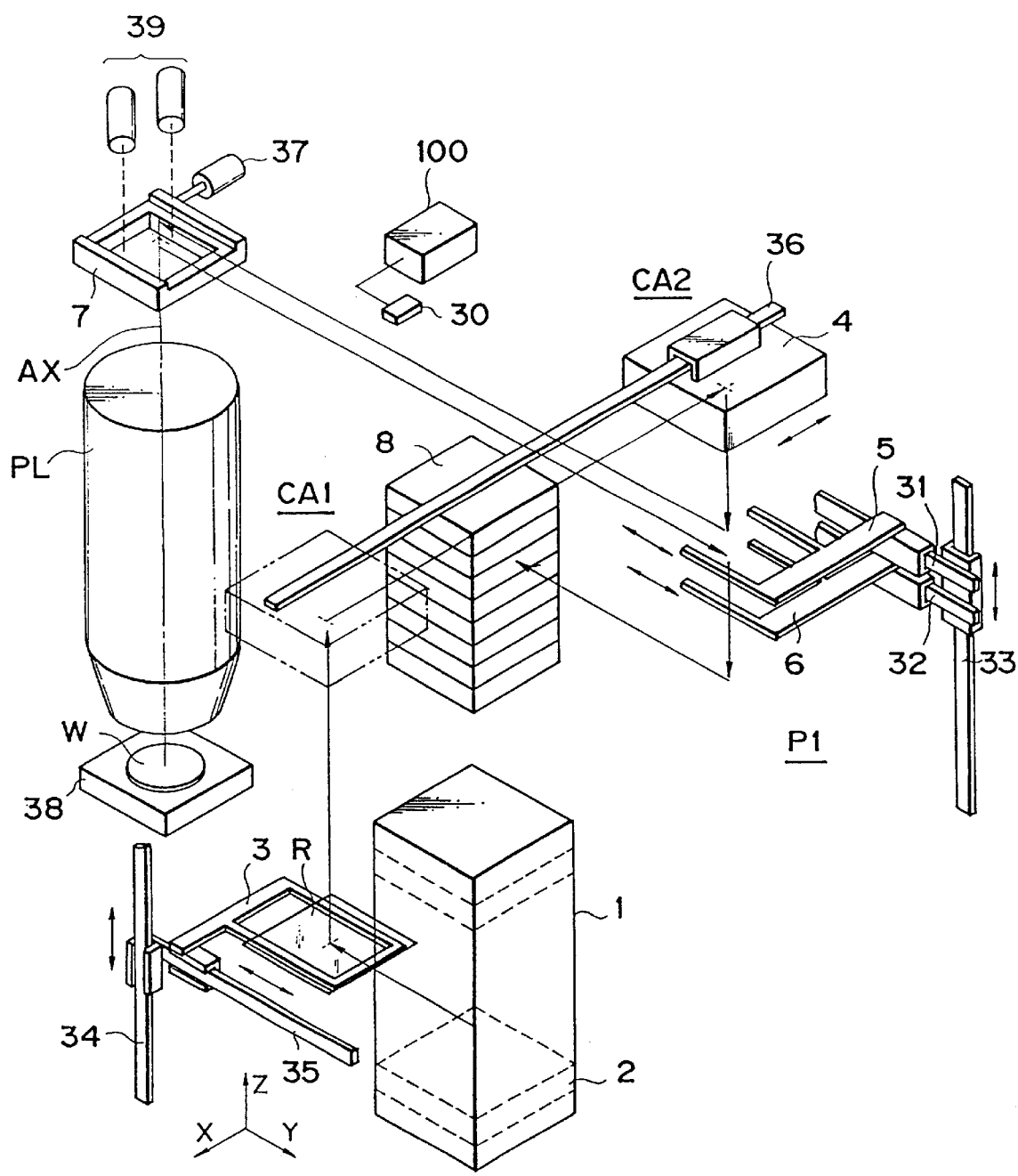
FIG. 1 is a view schematically illustrating a construction of an apparatus for carrying a substrate in one embodiment of the present invention.
Figure 7:
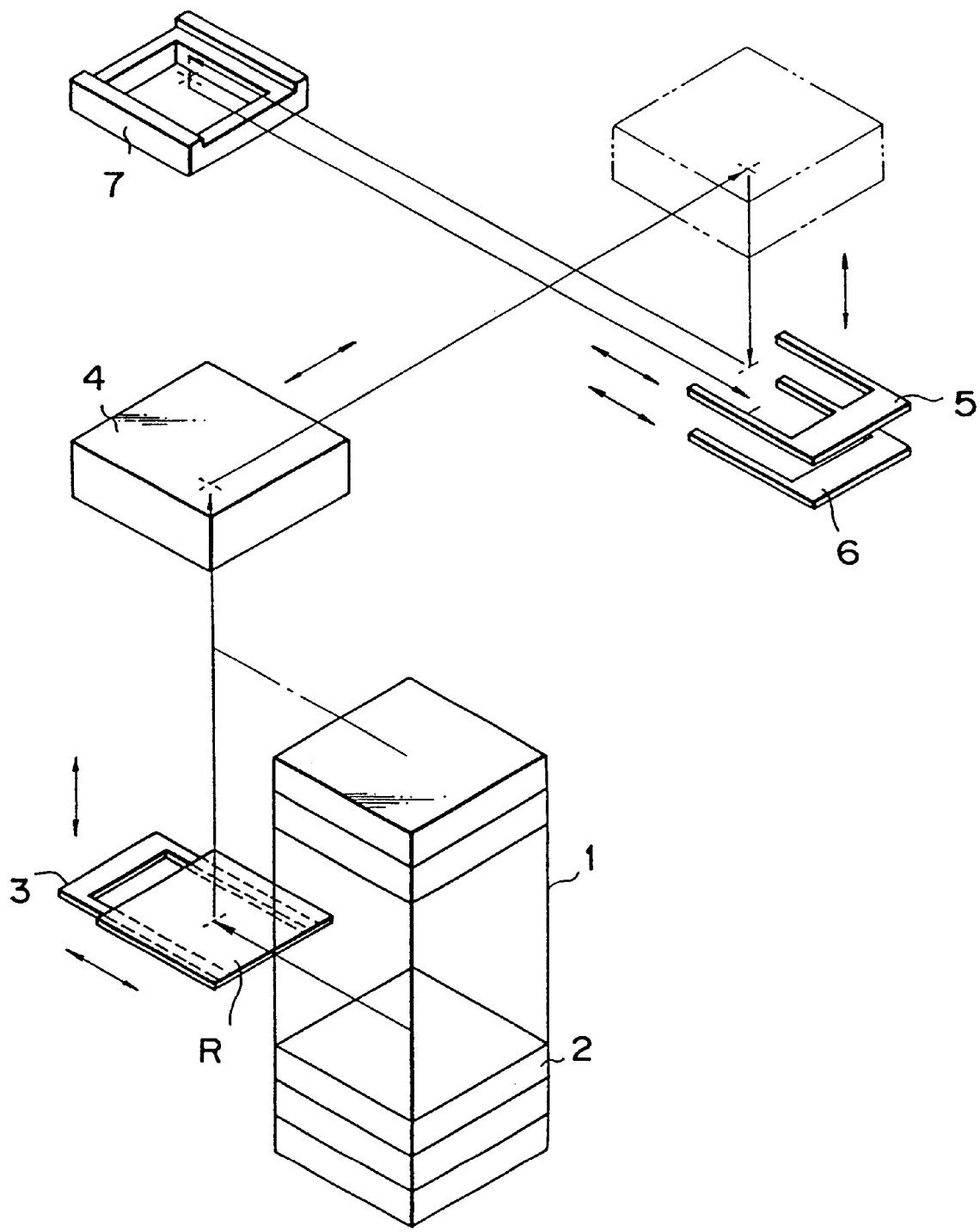
FIG. 7 is a view illustrating a conventional carrying apparatus.

One embodiment of an apparatus for carrying a substrate according to the present invention will hereafter be described with reference to FIG. 1. FIG. 1 is a perspective view schematically illustrating the substrate carrying apparatus. The same members as those in FIG. 7 are marked with like numerals.

The substrate carrying apparatus in this embodiment is constructed of a substrate storage part 1, a carrier arm 3, a carrier 4, a load arm 5, an unload arm 6, a temporary storage shelf 8 and a reticle stage 7. The substrate storage part 1 stores a plurality of substrate casings 2 receiving reticles R. The carrier arm 3 is movable in a direction Y through a slider 35. The carrier arm 3 is also movable in a direction Z through a slider 34. The carrier arm 3 takes only a reticle R out of a substrate casing 2 in the substrate storage part 1 and carries the reticle R to a carry position CA1. The carry position CA1 is a position where the reticle R is delivered from the carrier arm 3 to the carrier 4. The carrier arm 3 is formed with a vacuum adsorption hole. The reticle R is held and released by turning ON and OFF an unillustrated vacuum pump. The carrier 4 is movable in a direction X through a slider 36. The carrier 4 has an adsorption hole formed in a lower part thereof. The reticle R is held and released by turning ON and OFF an unillustrated vacuum pump. Further, the carrier 4 includes a prealignment mechanism having four fiducial sides. The reticle R is caught in from two directions orthogonal to each other on the basis of these four sides, thus effecting a prealignment. The carrier 4 prealigns the reticle R and simultaneously carries the reticle R to a position CA2 from the position CA1.

The load arm 5 is movable in the direction Y through a slider 31. The unload arm 6 is movable in the direction Y through a slider 32. Further, the load arm 5 and the unload arm 6 are also movable in a direction Z through a slider 33. The load arm 5 and the unload arm 6 are individually movable in the direction Y but move together in the direction Z. The load arm 5 and the unload arm 6 are, as in the carrier arm 3, formed with adsorption holes. These arms are capable of adsorptively holding and releasing the reticle R by turning ON and OFF a vacuum pump (not shown).

The reticle stage 7 is mounted with the reticle R for an exposure. The reticle stage 7 is provided above a projection optical system PL. The reticle R is carried onto the reticle stage and then located. A position detecting optical system 39 detects an alignment mark formed on the reticle R, thus measuring a position of the reticle R. Positional information of the reticle R is given from the position detecting optical system 39 and transmitted to a main control system 100. The main control system 100 controls a motor 37. The main control system 100 locates the reticle stage 7 with the aid of the motor 37 so that an optical axis AX of the projection optical system PL coincides with the center of the reticle R. The main control system 100 is herein capable of measuring a position of the reticle stage 7 from, e.g., a rotational quantity of the motor 37. The apparatus shown in FIG. 1 is provided with a bar code reader 30 for reading bar codes (not shown) formed on the reticle R. This bar code information is transmitted to the main control system 100. Pieces of identifying information (designations) of the reticles R are recorded in the bar codes. A sequence for selecting a plurality of reticles R is registered beforehand in the apparatus shown in FIG. 1. Based on the information of the bar codes information and the reticle information registered, it is possible to confirm whether or not the reticle R to be selected is correctly carried. Based on the identifying information of the reticle R, it is also feasible to count the number of times with which the same reticle R is carried. Further, pattern information and exposure conditions are recorded in the bar codes. The pattern information is utilized for setting the exposure conditions when forming an image of a pattern of the reticle on a wafer W placed on a two-dimensionally movable wafer stage 38 through the projection optical system PL.

The load arm 5 and the unload arm 6 cooperate to move the reticle R between the reticle stage 7 and the temporary storage shelf 8. The reticles R are, however, carried to the temporary storage shelf 8 by the unload arm 6 up to a termination of a lot size of the reticles R to be used. The temporary storage shelf 8 is positioned between the position CA2 and the reticle stage 7. Hence, a carry time is smaller than in the carry of the reticle R from the substrate storage part 1 to the reticle stage 7.

The main control system 100 controls driving of the reticle stage 7 and the wafer stage 38 as well as driving of the carrier arm 3, the carrier 4, the load arm 5 and the unload arm 6. The main control system 100 also generalizes the whole apparatus by performing a central management about the information given from the bar code reader 30 described above, the sequence to carry the reticles R, the ON/OFF vacuum control and the exposure conditions.

Figure 2A:
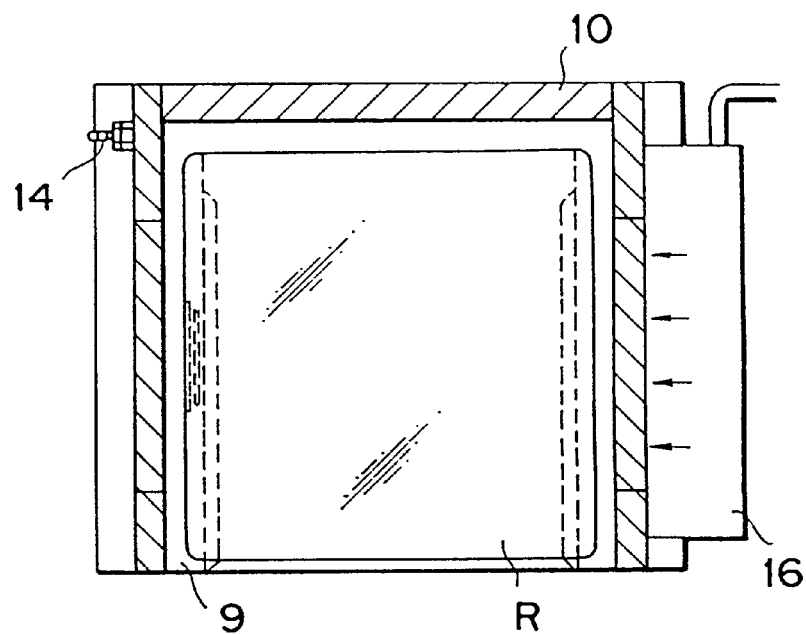
FIGS. 2A and 2B are views each showing an outline of a temporary storage shelf in one embodiment of the present invention.
Figure 2B:
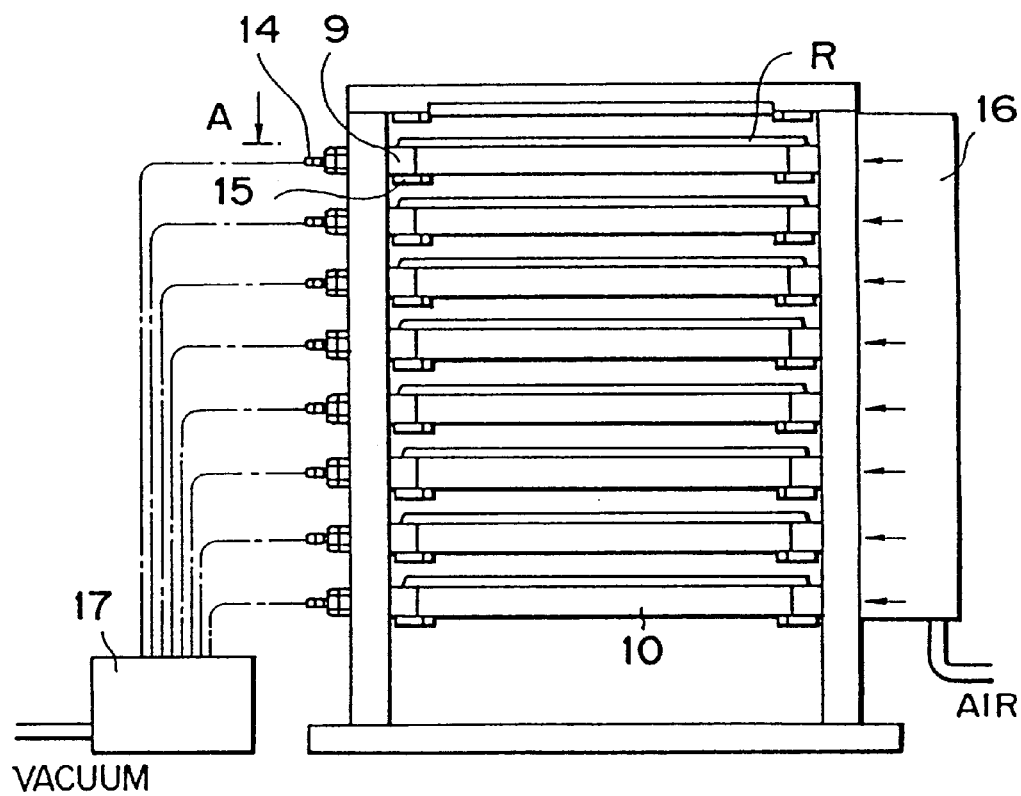
Figure 3:
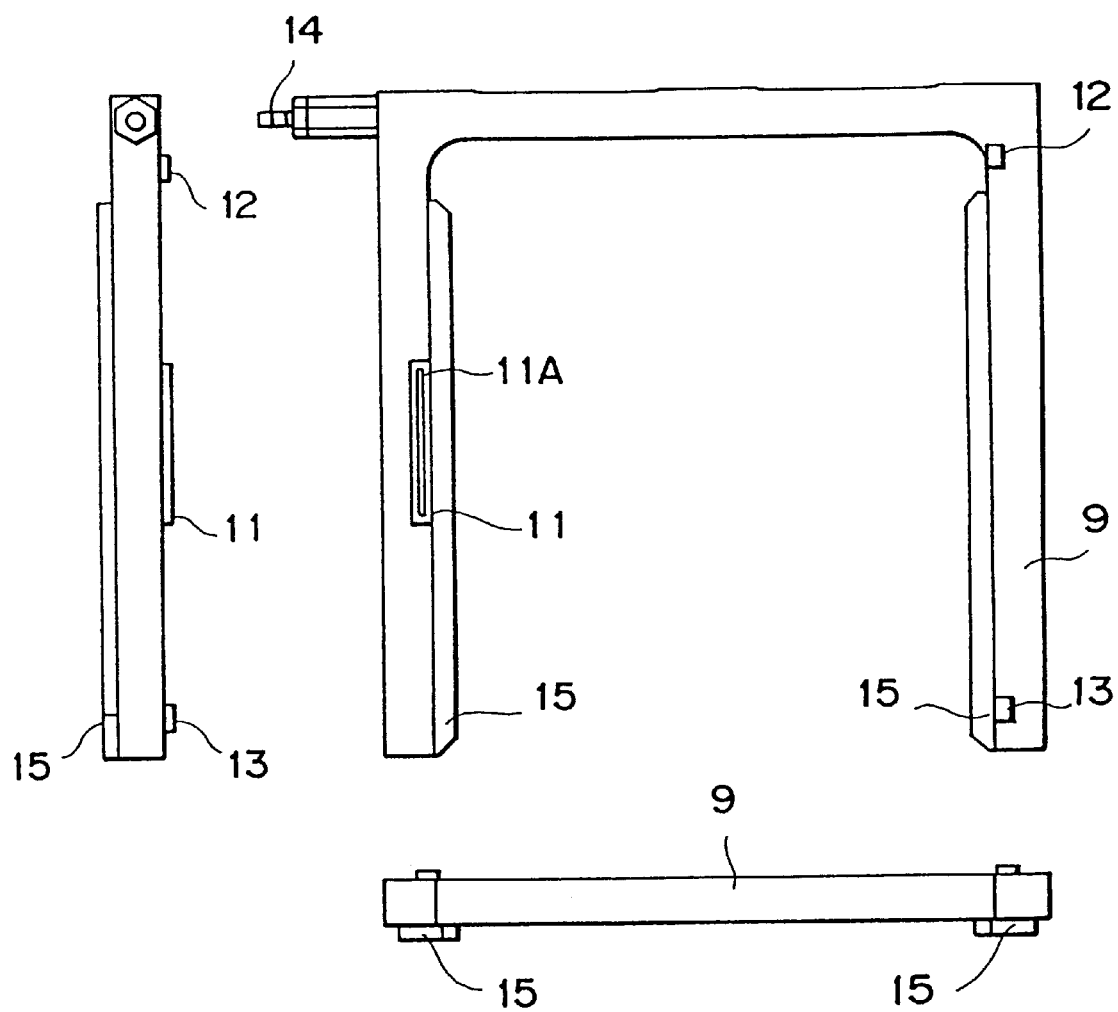
FIG. 3 is a view showing an adsorptive holding member of the temporary storage shelf in one embodiment of the present invention.

The following is an explanation of a structure of the temporary storage shelf 8 with reference to FIGS. 2A, 2B and 3. FIG. 2B is a front view of the temporary storage shelf 8. FIG. 2A is a view showing the temporary storage shelf 8 in section in the direction of an upper surface (arrowed direction A in FIG. 2B). Referring to FIGS. 2A and 2B, the temporary storage shelf 8 has a plurality (eight pieces in this embodiment) of substrate adsorbing members 9 each assuming a substantially C-shape. The adsorbing members 9 are fixed to a rear part 10 of the storage shelf 8 with a parallelism kept with each other. Each substrate holding member 9 adsorptively holds a reticle R in the temporary storage shelf 8.

As illustrated in FIG. 3, the substrate adsorbing member 9 has seat surfaces 11, 12, and 13 each protruding by a trace quantity from the substrate adsorbing member. These seat surfaces 11, 12, and 13 serve as contact surfaces with the reticle R. The seat surface 11 is formed with an air hole for vacuum adsorptive holding. The air hole of the seat surface 11 is vacuumized, thereby fixing the position of the reticle R. The air hole communicates with a pipe joint 14. The pipe joint 14 is connected to a pneumatic control unit 17 (FIGS. 2A and 2B) capable of independently adsorbing the same number of substrates as that of the substrate holding members 9 (corresponding to the number of substrates storable in the storage shelf 8). Each substrate can be thereby held in a predetermined position. Further, each substrate holding member 9 is provided with a partition plate 15. The partition plate 15 prevents the reticle R from being damaged when the arm contacts another reticle R due to a malfunction of the arm.

Now, referring back to FIGS. 2A and 2B, a clean filter 16 is provided on the side surface of this temporary storage shelf 8. The clean filter 16 is capable of supplying, as indicated by arrows, the air to the interior of the temporary storage shelf 8. A cleanness of environment ambient to the substrates stored therein can be thereby further enhanced.

Figure 4:
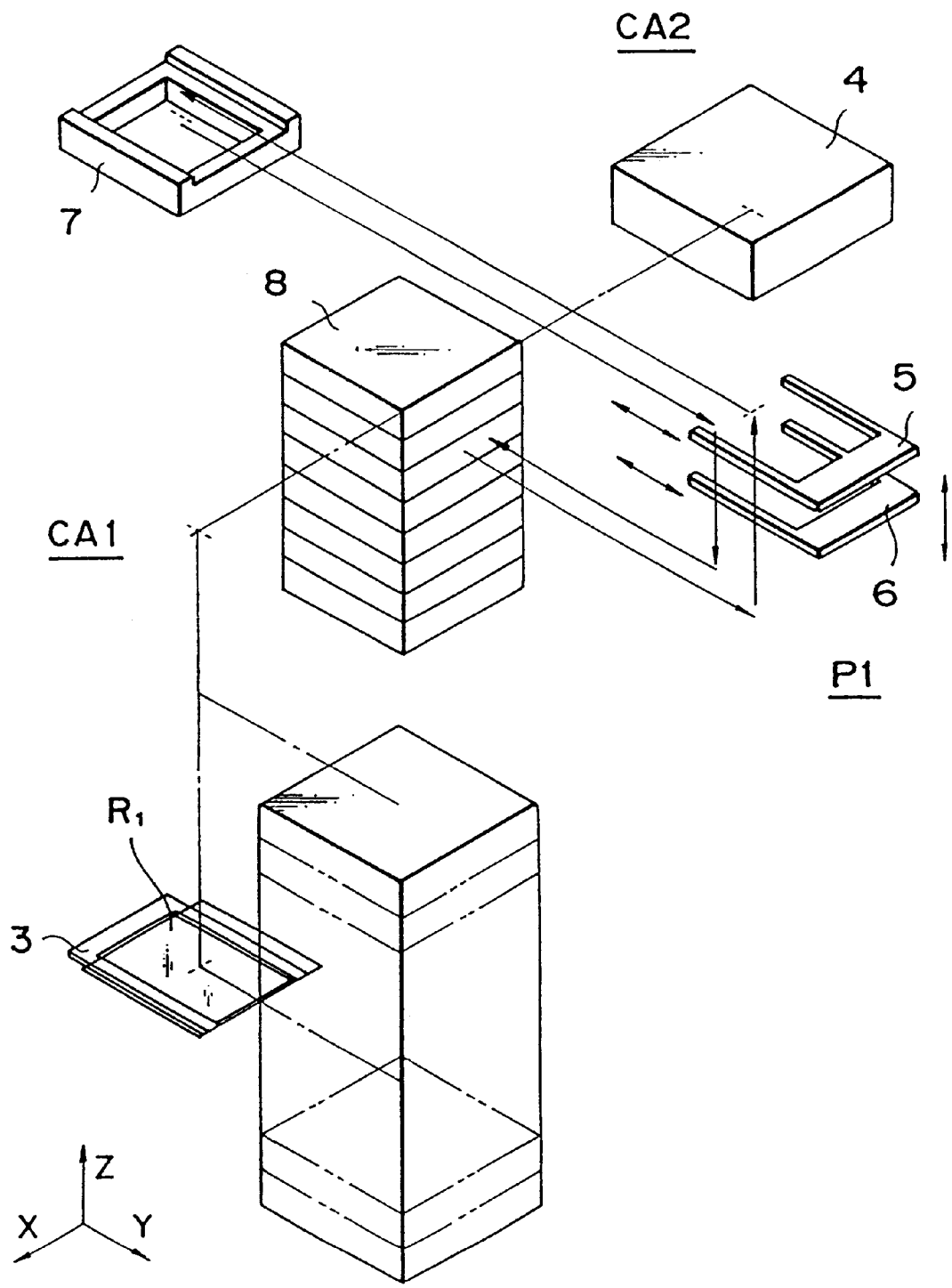
FIG. 4 is a view illustrating how a carry between the temporary storage shelf and a reticle stage is conducted in one embodiment of the present invention.
Figure 5:
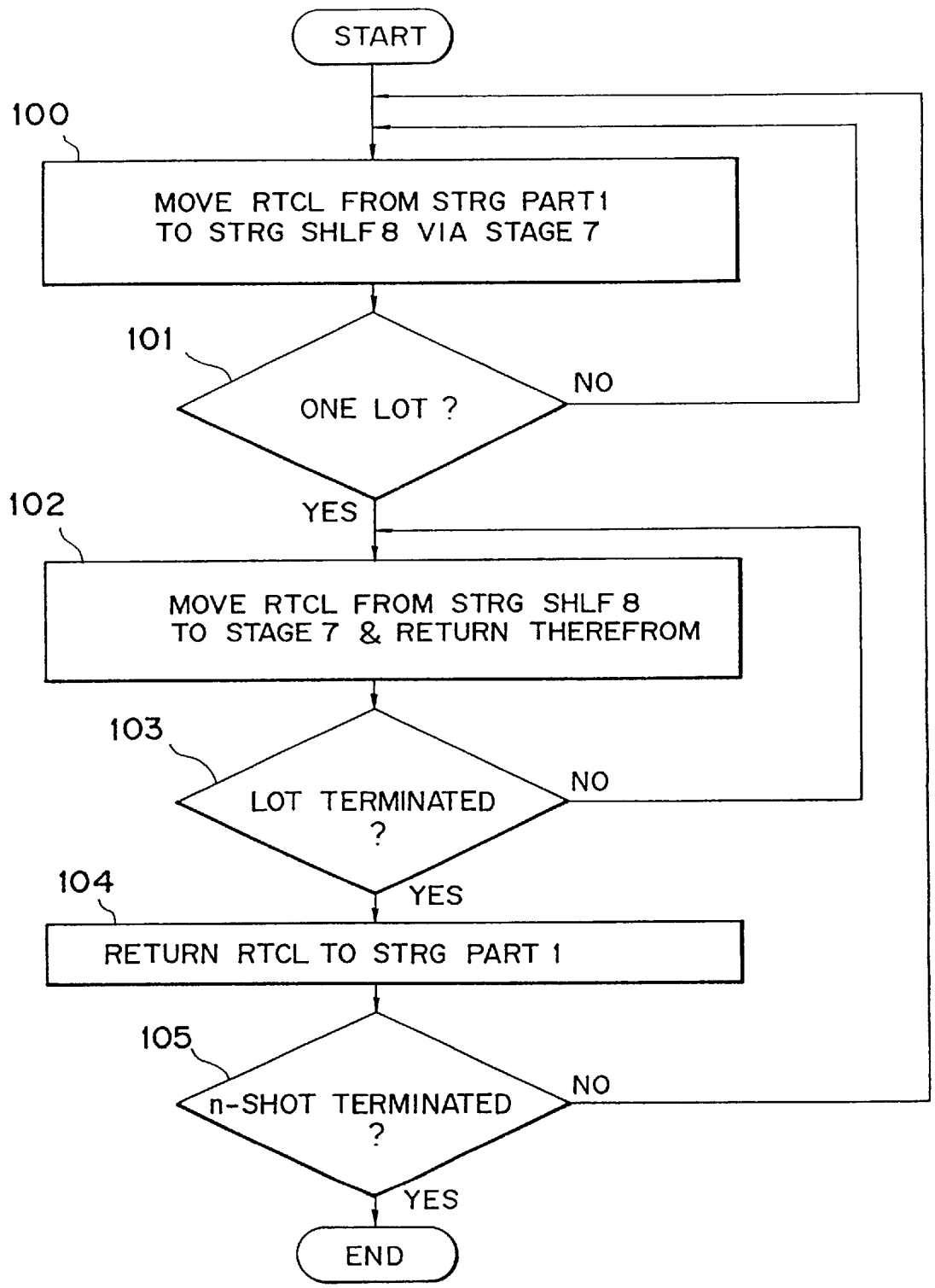
FIG. 5 is a flowchart showing carry operations in one embodiment of the present invention.

Next, a replacement of the substrates in one embodiment of this invention will be explained with reference to FIGS. 1, 4 and 5. FIG. 4 is a view partially illustrating the apparatus of FIG. 1. FIG. 5 is a flowchart showing one example of the replacement of substrates. In accordance with this embodiment, it is assumed that each reticle pattern is transferred onto a single wafer by a step-and-repeat action by using each of the plurality of reticles.

It is herein presumed that eight kinds of reticles ($R_1$~$R_8$) are employed for one lot in this embodiment.
[Step 100]
In FIGS. 1 and 4, the reticle $R_1$ is taken by the carrier arm 3 out of the substrate storage part 1. The carrier arm 3 carries the reticle $R_1$ to the position CA1. The carrier arm 3 delivers the reticle $R_1$ to the carrier 4.

The delivery is conducted by turning ON a vacuum of the carrier 4 but turning OFF a vacuum of the carrier arm 3.

Next, the carrier 4 carries the reticle $R_1$ to the position CA2 and simultaneously prealigns the reticle $R_1$. The load arm 5 receives the reticle $R_1$ from the carrier 4 in a position P1. The delivery is effected by turning ON a vacuum of the load arm 5 but turning OFF the vacuum of the carrier 4. The load arm 5 transfers the reticle $R_1$ to a deliverable position in the direction Z. Then, the load arm 5 moves up to the reticle stage 7 in the direction Y and delivers the reticle $R_1$ onto the reticle stage 7. The main control system 100 turns ON a vacuum of the reticle stage 7 but turns OFF the vacuum of the load arm 5, whereby the reticle $R_1$ is delivered onto the reticle stage 7 from the load arm 5. The load arm 5 retreats, after delivery, to a position enough not to hinder the exposure. The load arm 5 and the unload arm 6 move together in the direction Z after an exposure. The unload arm 6 moves, when raised up to a reticle $R_1$ receivable position in the direction Z, in the direction Y to receive the reticle $R_1$. Then, the unload arm 6 moves together with the load arm 5 in the direction Z up to a position where the reticle $R_1$ is deliverable to the temporary storage shelf 8. The unload arm 6 moves in the direction Y and enters between the substrate holding members 9. The unload arm 6 transfers the reticle $R_1$ to a predetermined position in the temporary storage shelf 8.

The reticle $R_1$ is delivered to the substrate holding member 9 by the vacuum ON/OFF operations described above. An error in terms of delivering the reticle R is small for a precision required by the apparatus and is therefore ignorable in the delivery of the reticle R on the basis of the vacuum ON/OFF operations as in this embodiment. Hence, the reticle R carried is adsorptively held in the temporary storage shelf 8 while keeping a position of alignment on the reticle stage 7 (a position of prealignment if the prealignment by the carrier 4 satisfies an alignment precision required by the apparatus).
[Step 101]
The main control system 100 judges whether or not a necessary number of reticles R for one lot have been carried to the temporary storage shelf 8. At this time, if the necessary number (8 pieces) for one lot is not reached, the reticle $R_2$ to be used next is delivered in the same manner as the above-mentioned to the load arm 5 via the carrier arm 3 and the carrier 4. The load arm 5 transfers the reticle $R_2$ onto the reticle stage 7. The unload arm 6 transfers the reticle $R_2$ into the temporary storage shelf 8 in the same way as that in step 100. At this moment, the reticle $R_2$ is transferred to an arbitrary substrate holding member 9 other than the substrate holding member 9 which holds the reticle $R_1$. Similarly, the reticles $R_3$~$R_8$ are stored in the temporary storage shelf 8.

When reaching the necessary number for one lot, the operation moves to step 102.
[Step 102]
The necessary number of reticles R are all stored in the temporary storage shelf 8, and hence the reticles R are transferred only between the temporary storage shelf 8 and the reticle stage 7 (see FIG. 4).

A carry of the reticle $R_1$ will be explained by way of one example. During a use of the reticle $R_8$ for exposure, the load arm 5 moves together with the unload arm 6 up to the deliverable position of the reticle $R_1$ in the direction Z and takes the reticle $R_1$ out of the temporary storage shelf 8. Then, the load arm 5 moves together with the unload arm 6 in the direction Z. The load arm 5 thereafter moves in the direction Y and transfers the reticle $R_1$ up to the vicinity of the reticle stage 7. Upon a termination of exposure by use of the reticle $R_8$, the unload arm 6 moves in the direction Y. The unload arm 6 thereafter moves in the direction Z and unloads the reticle $R_8$ from the reticle stage 7. Next, the load arm 5 moves in the direction Y and delivers the reticle $R_1$ onto the reticle stage 7. Then, during the use of the reticle $R_1$ for exposure, the unload arm 6 returns the reticle $R_8$ to the temporary storage shelf 8 from the reticle stage 7 in the same manner as that in step 100 discussed above. Then, the load arm 5 holds the reticle $R_2$ in a standby state in close proximity to the reticle stage 7. When the exposure of the reticle $R_1$ has been finished, the reticle $R_2$ is delivered onto the reticle stage 7 as in the case of the reticle $R_1$. Similarly, the reticles $R_2$~$R_8$ are reciprocated between the temporary storage shelf 8 and the reticle stage 7.
[Step 103]
The next action is to judge whether or not all the wafers to be processed by use of the reticles $R_1$~$R_8$ have been processed (the lot has been terminated). If the lot has not yet been terminated, the operation returns to step 102. Whereas if terminated, the operation proceeds to step 104.
[Step 104]
The reticles R after the exposure has been finished are returned to the substrate storage part 1 by operations reversed to those in step 100.

[Step 105]

Generally, the wafer undergoes an overlay exposure a plurality of times (e.g., m-times) by employing plural kinds of reticles. Hence, whether the m-times exposure has been terminated or not is judged. If the exposure is not yet performed m-times, the operation returns to step 100. The reticles for the second exposure are carried from the substrate storage part 1. Whereas if performed m-times, the carry of the substrate is herein finished.

The replacement of the substrate comes to an end through the steps described above. Note that the reticles $R_1 \sim R_8$ are sequentially processed for one wafer in the above-mentioned steps. However, a reticle placed on the reticle stage 7 when processing of eight reticles is finished may be employed for exposure continuously after a wafer replacement. Namely, after processing the reticles $R_1 \sim R_8$, the exposure is effected by using the reticle $R_8$ once again after the wafer replacement. The exposure is conducted in the sequence such as the reticle $R_8$, the reticle $R_1$, the reticle $R_2$ . . . the reticle $R_7$. Then, the next wafer may also undergo the exposure in the sequence such as the reticle $R_7$, the reticle $R_8$, the reticle $R_1$. . . the reticle $R_6$.

Further, the operational explanation has been given in step 102 on the assumption that the reticles $R_1 \sim R_8$ are stored in the temporary storage shelf 8. The same carrying actions may be performed during the exposure of a reticle carried directly from the substrate storage part 1 and during the carry of a reticle in the temporary storage shelf 8 (e.g., when carrying the reticle $R_1$ in the temporary storage shelf 8 during the exposure of the reticle $R_8$ carried directly from the substrate storage part 1).

Herein, the temporary storage shelf 8 incorporates the mechanism 11 (FIG. 3) for adsorbing each substrate. It is therefore possible to store a reticle R while keeping the position where the alignment is effected on the reticle stage 7. Further, as discussed above, the substrate is adsorptively held in the load arm 5, the unload arm 6, the reticle stage 7 and the temporary storage shelf 8. The substrate that has been once aligned on the reticle stage 7 does not shift in position even when repeatedly carrying the substrate.

The slider 31 serving as a carrier shaft of the load arm 5 is different from the slider 32 serving as a carrier shaft of the unload arm 6 (the load arm 5 and the unload arm 6 have independent carrier shafts). Hence, it can be considered that the carry positions of the reticles R by means of the respective arms have a trace amount of error.

For instance, even when the center of a reticle R coincides with the optical axis AX of the projection optical system PL on the reticle stage 7, the unload arm 6 has a trace amount of carry error in some cases. Hereupon, the central position of a reticle R shifts by a trace quantity from the position of the optical axis AX when carrying the reticle R to the temporary storage shelf from the reticle stage 7.

Concretely, the reticle R unloaded from the reticle stage 7 to the temporary storage shelf 8 by the unload arm 6 is carried from the temporary storage shelf 8 to the reticle stage 7 by the load arm 5. In consideration of this action, as explained before, the reticle R is adsorptively held during the carry and transfer in each position. For this reason, the position of the reticle R does not shift. If the carry position infinitesimally shifts in the fixed direction between the unload arm 6 and the load arm 5, however, it follows that the central position of the reticle R on the reticle stage 7 shifts by a carry error from the position of the optical axis AX. When repeatedly replacing the reticles R in such a state, errors in the reticles R are cumulative. An elimination of these errors may involve the prealignment effected by use of the above-mentioned carrier 4. At this time, the prealignment may be conducted by the carrier 4 when returning the reticle R to the temporary storage shelf 8 from the reticle stage 7. Alternatively, the prealignment may be effected every time the reticle is carried a predetermined number of times.

There are, however, increments both in a prealignment frequency and in a carry time. Further, as stated before, the alignment is performed on the reticle stage 7 every time the reticle R is carried to the reticle stage 7. For this reason, when effecting a fine alignment is between the reticle center and the optical axis AX on the reticle stage 7, a moving quantity of the reticle stage 7 increases. It therefore takes much time for the alignment. If a shift quantity further augments, the alignment cannot be done.

Hereupon, there will be given an explanation of a case where the reticle is carried in consideration of a shift quantity caused when carried. The following is a brief description of this method. A shift quantity (offset quantity) when a reticle carried is fed back onto the reticle stage 7 when the reticle is carried next time. The reticle stage 7 is moved beforehand by the offset quantity. Then, the load arm 5 delivers the reticle R onto the reticle stage 7 that has been previously moved. At this moment, the center of the reticle stage 7 is aligned with the center of the reticle R with no deviation quantity. After the load arm 5 has retreated, the reticle stage 7 moves by an offset quantity toward the fiducial position (where the center of the reticle R coincides with the optical axis AX) while adsorptively holding the reticle R. Since the fine alignment has been executed during the exposure of the last time, ideally the center of the reticle R substantially coincides with the optical axis AX in this state. The alignment time of the reticle is thereby shortened.

Figure 6:
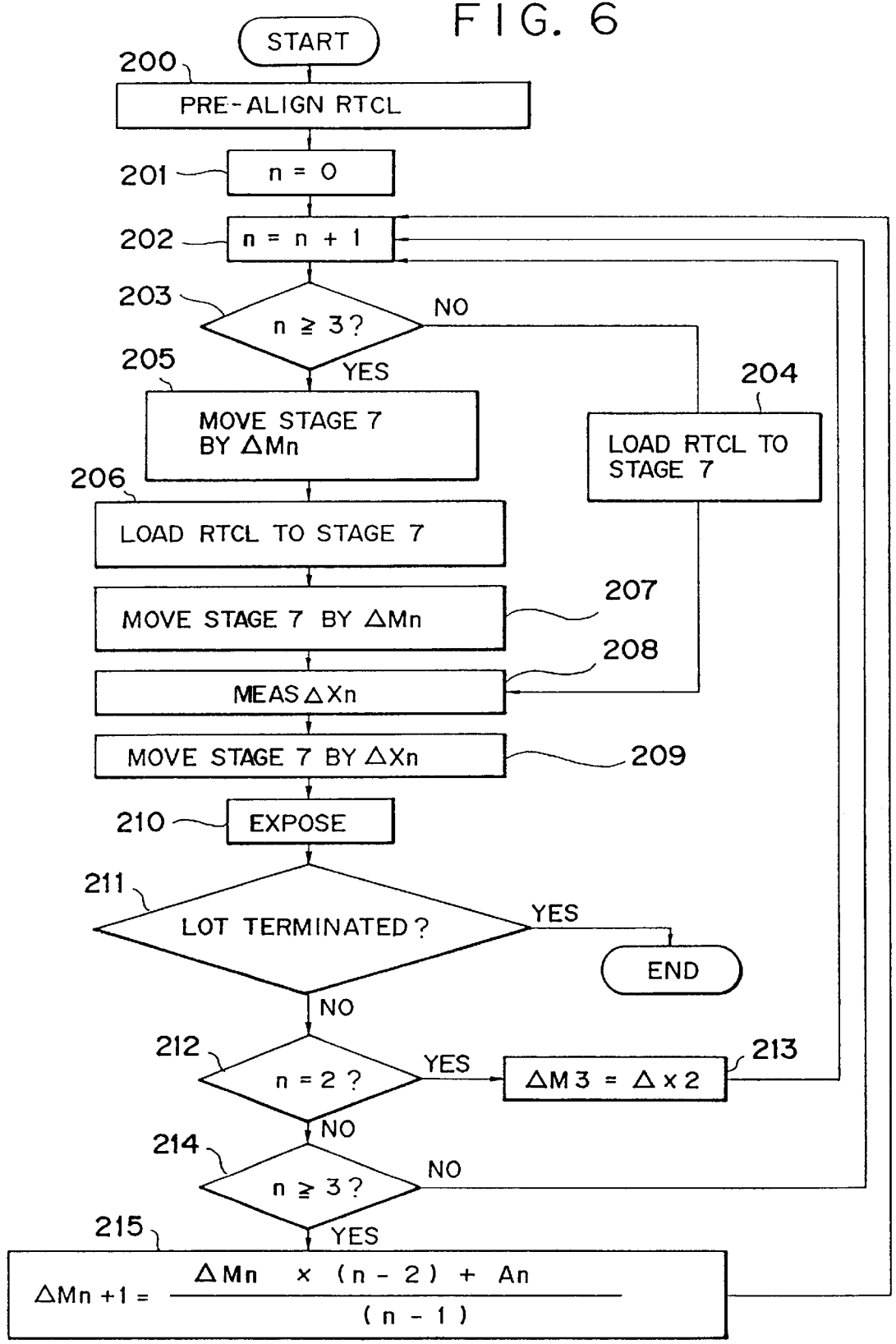
FIG. 6 is a flowchart showing the carry operations in consideration of a carry error in one embodiment of the present invention.

The following is a description of one example of a method of corresponding to a carrier shift without performing the prealignment by use of the carrier 4, with reference to FIG. 6. FIG. 6 is a flowchart showing the method of corresponding to the carry deviation without effecting the prealignment. Incidentally, it is assumed that the reticle stage 7 is located in the fiducial position described above in an initial state. Further, the reticle is confirmed by the bar code reader 30 in FIG. 6, and the number of carries to the reticle stage is measured.

[Step 200]

The reticle R is carried by the carrier 4. The carrier 4 prealigns the reticle R.

[Step 201]

When prealigned, a reticle carry number counter in the main control system 100 is reset to zero (n=0: n herein indicates the carry number).

[Step 202]

The bar code reader 30 counts the carry number of the reticle R before the reticle R is carried to the reticle stage 7.

[Step 203]

If the carry number n is 3 or more, the operation proceeds to step 205. Whereas if the carry number is less than 3, the operation proceeds to step 204.

[Step 204]

The load arm 5 sets the reticle R on the reticle stage 7, and the operation proceeds to step 208.

[Step 208]

The position detecting optical system 39 measures a deviation ($\Delta x$, $\Delta y$) of the center of the reticle R from the optical axis AX. For convenience, only a deviation quantity $\Delta xn$ in the direction X will be explained.

The main control system 100 stores the positional deviation quantity $\Delta xn$.

The main control system 100 moves the reticle stage 7 by Δxn so that the center of the reticle R coincides with the optical axis AX. The main control system 100 stores the position of the reticle stage 7 as a fiducial position at this time.

[Step 210]

Exposing is executed under the generalized control of the main control system. After an end of exposure, the unload arm 6 carries the reticle R out of the reticle stage 7.

[Step 211]

Judged is whether or not a wafer lot to be processed comes to a termination. If judged to be terminated, the reticle R is carried to the substrate storage part 1. Whereas if the lot is judged to be unterminated, the operation proceeds to step 212.

[Step 212]

If the carry number of the reticle R is 2, the operation proceeds to step 213. Whereas if not, the operation proceeds to step 214.

[Step 213]

The main control system 100 stores an offset quantity ΔM3 caused when the reticle R is carried a third time to the reticle stage 7 as a moving quantity Δxn (Δx2) of the reticle stage 7 in step 209. Then, the operation returns to step 202 wherein the counter is incremented by 1.

[Step 214]

If the carry number of the reticle R is 3 or more in step 214, the operation proceeds to step 215. In cases other than this, the operation returns to step 202.

[Step 215]

The main control system 100 calculates an offset quantity ΔMn+1 in the case of carrying the reticle R (n+1)-th time (next to the carry of the n-th time). The offset quantity Δn+1 is obtained by averaging a total sum of the offset quantities (ΔM3, ΔM4, ... ΔMn) given so far and an offset quantity An (a sum of the reticle stage moving quantity ΔMn in step 207 and the stage moving quantity Δxn in step 209) of the reticle stage position provided with an offset in the n-th carry from the fiducial position. Namely, the offset quantity ΔMn+1 is obtained by averaging the total sum of the offset quantities including the offset quantity An of this time (n-th time).

This offset quantity is expressed in the following equation:

$$\Delta Mn+1[\Delta Mn \times (n-2) + An] \div (n-1)$$

(where An=ΔMn+Δxn).

This offset quantity ΔMn+1 is stored in the main control system 100, and the operation returns to step 202.

With the operations discussed above, it is possible to attain the carry of the substrate to cause no positional deviation due to the error in the carrying system without performing the prealignment. When averaging the offset quantities herein, a total sum of the offset quantities in only several carries in the past can be used. Note that the explanation has dealt with only the deviation quantity in the direction X in steps 200 to 215. However, a deviation quantity in the direction Y is similarly obtained. The reticle stage 7 may be likewise moved beforehand by the offset quantity in the direction Y.

Further, the load arm 5 may be constructed to be movable in the directions X, Y. A reticle R may be carried to the reticle stage 7 with a movement of the load arm 5 by offset quantities (the offset quantities both in the direction X and in the direction Y).

Besides, the offset quantity of the last time may be used directly as a next offset quantity. In this case, the offset quantity varies with a passage of time. Hence, the deviation quantity Δxn obtained in step 209 may be added to the offset quantity to obtain a new offset quantity. That is, the offset quantity of the last time may be sequentially updated by the deviation quantity Δxn obtained in step 209. In addition, the carry number in step 201 may serve as a carry number from the temporary storage shelf 8.

Furthermore, the offset quantities described above are individually managed per reticle. The operations in steps 202~215 may be, however, performed in the sequence of the reticles to be carried without discriminating the respective reticles ($R_1$~$R_8$) needed.

Further, in the operations described above, the exposure is at first conducted by use of a reticle R carried from the substrate storage part 1. Thereafter, the reticle R is stored in the temporary storage shelf 8. At the first onset, however, a necessary number of reticles R are stored in the temporary storage shelf 8 via the carrier arm 3, the carrier 4 and the load arm 5 (or the unload arm 6). Then, the operations from above-mentioned step 103 onward may be effected.

Additionally, if the temporary storage shelf is provided with an alignment mechanism, the substrate can be always stored in the storage shelf 8 without causing any positional deviation. The alignment mechanism may be constructed such that, for example, an external wall of the temporary storage shelf 8 is formed with an opening, and the substrate is caught from two directions on the basis of edge sides thereof. The alignment mechanism performs aligning in the temporary storage shelf 8.

Further, in the description given above, the load arm 5 and the unload arm 6 move together in the direction Z but may be individually movable. Because of being individually movable, the unload arm puts the reticle into the temporary storage shelf 8 in, e.g., step 100 described above. During this action, the load arm is capable of carrying the reticle to the reticle stage 7, thereby improving a throughput. Besides, the load arm 5 and the unload arm 6 are thus constructed to be individually movable in the direction Z, whereby the moving quantities of the arms can be reduced.

Another embodiment of a substrate transfer apparatus according to the present invention will now be described.

In accordance with this embodiment, the present invention is designed with a view toward further shortening the transfer path of a substrate (reticle, etc.) and replacing the substrate at high speed. In the form shown, the embodiment is applied to a reticle loader system of a projection exposure apparatus.

Figure 8:
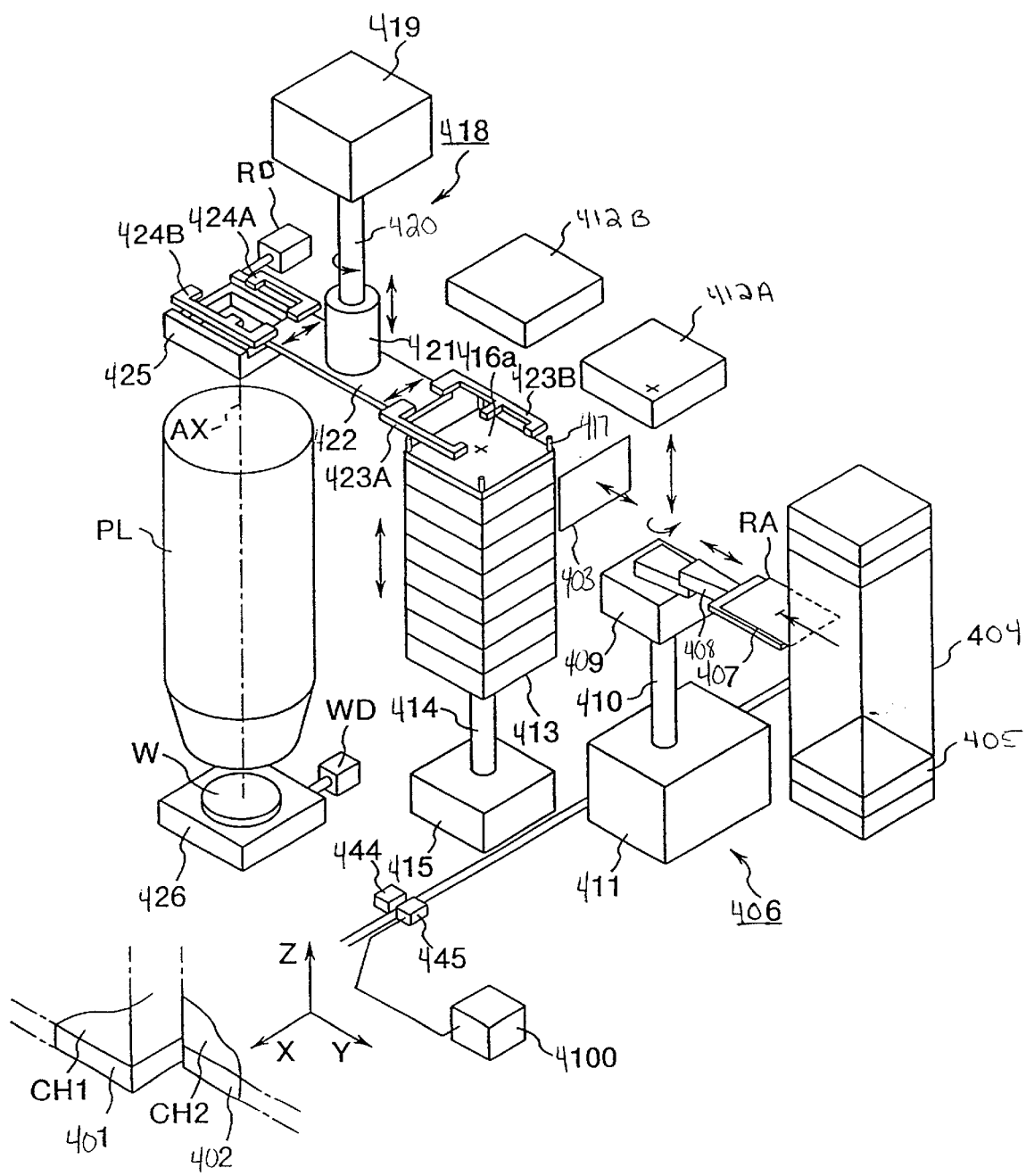
FIG. 8 is a perspective view illustrating the principal portion of a projection exposure apparatus to which one embodiment of a substrate transfer apparatus of the present invention is applied.

FIG. 8 illustrates the projection exposure apparatus in this embodiment. Referring to FIG. 8, a first chamber CH1 (only some portions thereof are illustrated) is installed on a first base 401 (only some portions thereof are shown) secured onto an unillustrated vibration proof board. An exposure unit of the projection exposure apparatus is installed within the first chamber CH1. Further, a second base 402 (only some portions thereof are illustrated) is installed adjacent to the base 401, and a second chamber CH2 (only some portions thereof are shown) is placed on the base 402. Some elements of the reticle loader system and a reticle library 404 are installed into the second chamber CH2. Then, the first chamber CH1 and the second chamber CH2 are constructed to transfer and receive a reticle through a window 403. In FIG. 8 also, a Z-axis is parallel to the optical axis AX of a projection optical system PL of the projection exposure apparatus, while a rectangular coordinate system on the plane perpendicular to the Z-axis is taken on X- and Y-axes.

The reticle library 404 and multiaxial robot hand 406 are mounted on the second base 402. The multiaxial robot hand 406 is constructed of a support member 411 installed on the base 402, a Z-axis slider 410 slidably mounted on this support member 411 in a Z-direction and a rotary board 409 rotatably mounted on this Z-axis slider 410. The robot hand 406 is further constructed of an extensible/contractible member 408 so mounted on this rotary board 409 as to be extensible and contractible from the rotary shaft in the radial direction and a. substantially-C-shaped hand member 407 fixed to the front edge of this extensible/contractible member 408. Three vacuum adsorptive members are disposed on the hand member 407. A Z-directional position is adjusted by the Z-axis slider 410, and the hand member 407 is inserted into the reticle library 404 through the extensible/contractible member 408, whereby a reticle RA is transferred to and received from a desired reticle casing 405 within the reticle library 404.

Further, the reticle RA is transferred and received between the first chamber CH1 and the second chamber CH2 via the window 403 by the hand member 407. Moreover, a locating plate (for locating on the basis of edge surfaces of the reticle RA) 412A formed with edge surfaces serving as a basis for locating the reticle RA is disposed on the multiaxial robot hand 406. The Z-axis slider 410 is extended to push the reticle RA adsorbed onto the hand member 407 against the locating plate 412A, thereby performing rough locating (prealignment) of the reticle.

A wafer stage 426 of the projection exposure apparatus is mounted on the first base 401, and a wafer W as an object for exposure is placed on the wafer stage 426. The wafer stage 426 is two-dimensionally movable in X- and Y-directions by a drive unit WD. A pattern of the reticle on the reticle stage 425 is exposed on each shot area of the wafer W through the projection optical system PL. A support board 415 is provided between the projection exposure apparatus and the window 403, and a cache storage 413 is mounted on the support board 415 through the Z-axis slider 414 slidable in the Z-direction. An upper portion of the cache storage 413 serves as a standby surface 416a. Four substrate support pins 417 for placing the reticle are embedded into the standby surface 416a. Further, a locating plate 412B for locating the reticle is provided upwardly of the cache storage 413. Then, a rotary arm device 418 is attached between the cache storage 413 and the projection exposure apparatus.

Figure 10A:
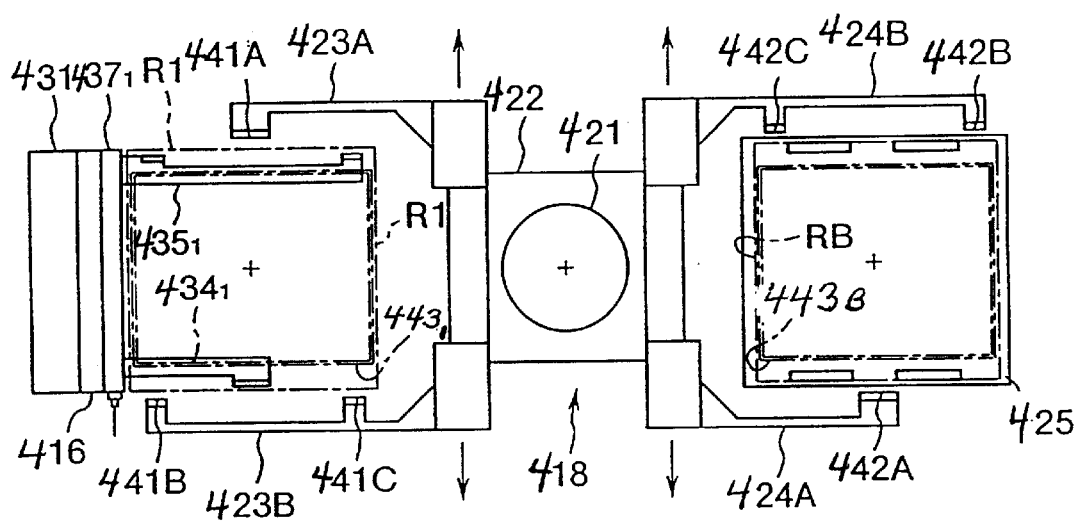
FIG. 10A is a sectional view taken along the line 10A—10A of FIG. 10B.

The rotary arm device 418 is constructed of a support board 419 fixed to an unillustrated top plate, a Z-axis slider 420 so secured to a lower surface of the support board 419 as to be slidable in the Z-direction and a rotary member 421 rotatably attached to the front edge of this Z axis slider 420. The rotary arm device 418 is further constructed of an arm mounting plate 422 fixed to the front edge of this rotary member 421, a pair of arms 423A, 423B attached to one edge of this arm mounting plate 422 and a pair of arms 424A, 424B attached to the other edge thereof. In this case, the arms 423A, 423B are so attached to the arm mounting plate 422 as to be openable and closable. The arms 424A, 424B are also so attached to the arm mounting plate 422 as to be openable and closable. As illustrated in FIG. 10A, the arms 423A, 424A are formed with vacuum adsorptive holes 441A, 442A, respectively. The arms 423B, 424B are formed with vacuum adsorptive holes 441B, 441C and 442B, 442C, respectively. The reticles are adsorptively held on the arms 423A, 423B and the arms 424A, 424B, respectively.

Referring back to FIG. 8, a magnet 444 is mounted on the first base, while a magnetic-sensor 445 is mounted in a face-to-face relationship with the magnet 444 on the second base 402 in this embodiment. The magnetic sensor 445 detects a relative displacement between the first base 401 and the second base 402. An item of data from the magnetic sensor 445 is transferred to a main control system 4100. The main control system 4100, if this relative displacement exceeds a predetermined allowable value, uses a sequence of stopping a transfer of the reticle from the multiaxial robot hand 406 to the rotary arm device 418. Note that a displacement detector of an optical type or the like may be employed instead of the magnetic sensor 445.

Figure 9A:
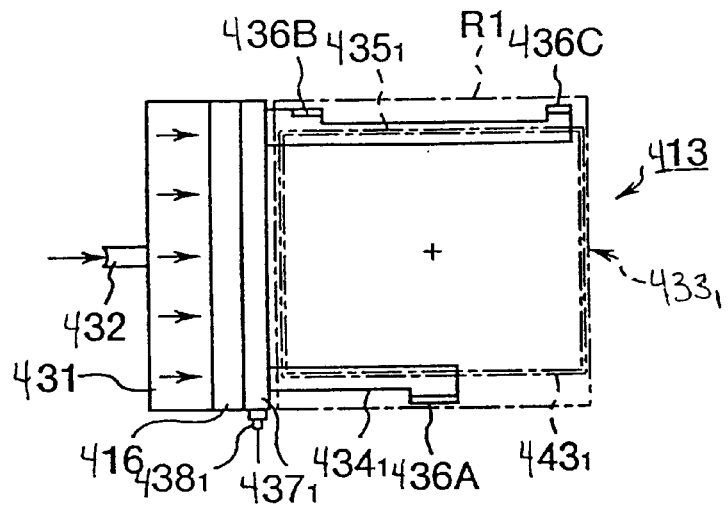
FIG. 9A is a sectional view taken along the line 9A—9A of FIG. 9B.
Figure 9B:
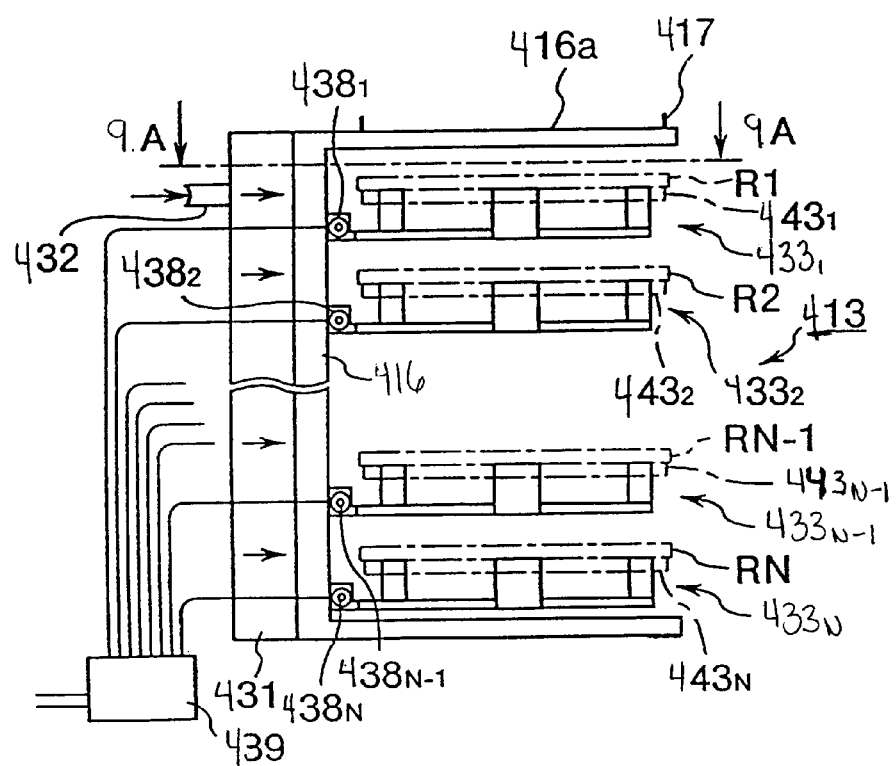
FIG. 9B is a side view showing a cache storage 413 in FIG. 8.

Next, a structure of the cache storage 413 will be explained with reference to FIGS. 9A and 9B. FIG. 9B is a side view of the cache storage 413. FIG. 9A is a sectional view taken along the line 9A—9A of FIG. 9B. Referring to FIGS. 9A and 9B, the cache storage 413 is constructed such that a frame 416 taking a substantially C-shape in section houses N (N is, e.g., 8) reticle holding members $433_1$, $433_2$, ..., $433_N$; besides, a clean filter plate 431 is fixed to a rear surface of the frame 416; and a piping joint 432 is connected to the rear surface of the clean filter plate 431. A side plate of the frame 416 is formed with a multiplicity of air holes, whereby the air from an unillustrated air conditioner is blown from the side surface of the frame 416 through the piping joint 432 and the clean filter plate 431 toward the reticle holding members $433_1$, ... $433_N$. A degree of cleanness of an ambient environment for the housed reticles can be thereby further enhanced.

Moreover, as illustrated in FIG. 9A, the reticle holding member $433_1$ is constructed such that a holding unit $434_1$ formed with a vacuum adsorptive hole 436A and a holding unit $435_1$ formed with vacuum adsorptive holes 436B, 436C are fixed to both edges of a lateral shaft $437_1$ secured to the frame 416. An interval between the holding parts $434_1$ and $435_1$ is set narrower than a width of the reticle placed thereon. Besides, a dustproof-oriented pellicle for the patterns on the reticle extends over the reticle through a predetermined frame (pellicle frame) in some cases, and, therefore, the interval between the holding units $434_1$ and $435_1$ is set wider than a pellicle frame $443_1$ of a reticle R1 placed thereon. Further, the vacuum adsorptive holes 436A, 436B, 436C are connected to a pipe $438_1$ attached to the lateral shaft $437_1$. Other reticle holding units $433_2$, ..., $433_N$ are also similarly constructed.

Further, as illustrated in FIG. 9B, individual pipes $438_1$, ..., $438_N$ of the reticle holding units $433_1$, ..., $433_N$ are connected to a vacuum source 439. Each of reticles R1–RN can be adsorptively held or released from being adsorbed on the reticle holding units $433_1$, ..., $433_N$ by switching ON/OFF the vacuum source 439. Pellicle frames $443_1$–$443_N$ are attached respectively to the reticles R1–RN in this embodiment.

Given next is an explanation about one example of an operation of placing the reticle on the reticle stage 425 via the cache storage 413 from the reticle library 404 by use of the reticle loader system. First, the hand member 407 of the multiaxial robot hand 406 takes out the reticle RA from within the predetermined reticle casing 405 in the reticle library 404, and, thereafter, the Z-axis slider 410 is raised, thus making a prealignment on the basis of the edge surfaces thereof by using the locating plate 412A. Thereafter, the multiaxial robot hand 406 carries the reticle RA onto the standby surface 416a via the window 403.

The standby surface 416a is provided with four substrate support pins 417 in positions that do not interfere with the pellicle frame on the reticle. The hand member 407 places the reticle on these substrate support pins 417. The upper edges of the substrate support pins 417 are set substantially flush with the upper surface of the reticle stage 425. Then, the arms 423A, 423B of the rotary arm device 418 on the side of the standby surface 416*a* are positioned under the reticle on the substrate support pins 417. After closing the front edges of these arms, the Z-axis slider 420 is made to rise, thereby raising the reticle from the substrate support pins 417. Thereafter, the arm mounting plate 422 is rotated through 180° by driving the rotary member 421, and the Z-axis slider 420 is again lowered.

The substrate support pins 417 are positioned flush with the reticle holding surface of the reticle stage 425, and hence, the reticle is placed on the reticle stage 425. Then, the front edges of the arms 423A, 423B are opened, and an unillustrated high-accuracy position measuring device (reticle alignment microscope, etc.) measures a reticle position on the reticle stage 425. After correcting the position of the reticle stage 425, the reticle patterns are exposed on the wafer W through the projection optical system PL.

The projection exposure apparatus in accordance with this embodiment is a step-and-scan type exposure apparatus. The reticle stage 425 is moved in the X-direction (or Y-direction) by a drive unit RD within the horizontal plane during the exposure, and the wafer stage 426 is moved (scanned) in the X-direction by a drive unit WD, synchronizing with the movement of the reticle stage 425. The wafer stage 426 is moved by stepping in the X- and Y-directions, thereby making it possible to expose the plurality of shot areas on the wafer (stepping). The step-and-scan type exposure apparatus is the apparatus which performs the exposure by combining the stepping and scanning operations in this way. When the reticle stage 425 is moved (scanned) in the X-direction, and after opening the front edges of the arms 423A, 423B, the Z-axis slider 420 is ascended. Thus, the arms 423A, 423B may be moved off up to positions higher than the reticle. Further, the arm mounting plate 422 is raised a little bit in the Z-direction, and, thereafter, the arms 423A, 423B may also be rotated through 90° and thus moved off the reticle stage 425. At this time, only the portion of the arm mounting plate 422 on the side of the arms 423A, 423B may also be rotated through 90° about the rotary member 421.

Further, in accordance with this embodiment, the support board 411 of the multiaxial robot hand 406 and the support board 415 for the cache storage 413 are mounted on the base 402 and the base 401, separately. Therefore, if a positional deviation exceeding a predetermined allowable value is produced between the base 401 and the base 402, there exists a possibility that a positional deviation will be caused when placing the reticle on the standby surface 416*a* of the cache storage 413 from the multiaxial robot hand 406 even after effecting the prealignment of the reticle by use of the locating plate 412A on the side of the multiaxial robot hand 406. Then, in this situation, the reticle is placed on the substrate support pins 417 on the cache storage 413, and, thereafter, the Z-axis slider 420 is raised. Then, the side surface of the reticle is brought into contact with a fiducial surface in the locating plate 412B, and the pre-alignment may be thus effected on the basis of the edge surfaces. With this operation, the prealignment process on the reticle stage 425 can be omitted.

Further, as already explained, if a quantity of the positional deviation between the bases 401 and 402 that is detected by the magnetic sensor 445 exceeds the predetermined allowable value, it is possible to eliminate the locating plate 412B on the cache storage 413 when adopting a sequence of stopping the transfer of the reticle onto the cache storage 413 from the multiaxial robot hand 406.

A main control system 4100 controls the robot hand 406, the rotary arm device 418, the Z-axis slider 414, the drive units RD, WD and, in addition, the apparatus as a whole.

Next, an operation of replacing, after finishing the exposure of the reticle on the reticle stage 425, this will be explained by itemizing this operation.

(A) Replacing the reticle on the substrate support pins 417 on the cache storage 413.

In this case, the reticle placed on the substrate support pins 417 is replaced with the reticle on the reticle stage 425.

At this time, the reticle on the substrate support pins 417 is taken out by the multiaxial robot hand 406 from within the reticle library 404 and is, after effecting the prealignment by use of the locating plate 412A, set by the multiaxial robot hand 406. The reticle on the substrate support pins 417 waits till the exposure of the reticle on the reticle stage 425 is finished.

Next, when finishing the exposure using the reticle, the arms 423A, 423B and the arms 424A, 424B of the rotary arm device 418 are respectively closed on the side of the lower surfaces of the corresponding reticles. Thereafter, in a state where the reticle is released from being vacuum adsorbed in combination with the reticle stage 425, the Z-axis slider 420 of the rotary arm device 418 is made to slightly rise in the Z-direction, thereby raising the corresponding reticles in the Z-direction by the arms 423A, 423B and the arms 424A, 424B.

Then, in the vacuum-adsorbed state of the reticle, the rotary member 421 is rotated through 180°, and thereafter, the reticle is released from the vacuum adsorption. Then, the Z-axis slider is lowered. The replacement of the reticle on the reticle stage 425 with the reticle on the substrate support pins 417 is ended with this operation. Thereafter, the arms 423A, 423B and the arms 424A, 424B are opened and then moved back to the predetermined positions by the Z-axis slider 420 as the necessity arises. The reticle unloaded from the standby surface 416*a* is, if not intended to be used any more, returned to the reticle library 404 by use of the multiaxial robot hand 406 via a path opposite to the loading path. In the case of exposing the patterns for, e.g., ASIC, however, the unloaded reticle is repeatedly employed. In this case, the reticle is housed in the cache storage 413.

(B) A preparation for housing the reticle in the cache storage 413.

As illustrated in FIG. 9B, as far as space permits, the cache storage 413 is capable of housing N (N is an integer of 2 or larger) reticles, but, it is assumed herein that N is 8 (the number of the reticles housed is 8 at the maximum), and the reticles housed are expressed as reticles R1–RN.

In this case, referring back to FIG. 8, it is also assumed that a first reticle (termed [R1]) is exposed on the reticle stage 425, and, meanwhile, a second reticle (termed [R2]) which is to be exposed is in a standby status on the substrate support pins 417 on the standby surface 416*a*.

In this instance, when finishing the exposure of the reticle R1, the arms 423A, 423B and the arms 424A, 424B of the rotary arm device 418 are closed and respectively enter under the lower surfaces of the reticles R1, R2. Thereafter, the arm mounting plate 422 is rotated through 90° with the aid of the rotary member 421 in a state where the reticles R1, R2 are raised by lifting the Z-axis slider 420. Thereafter, the Z-axis slider 414 is raised so that the reticle placing surface of the first reticle holding unit $433_1$ (see FIG. 9B) in the cache storage 413 is flush with the reticle stage 425. After this processing, the arm mounting plate 422 is further rotated through 90° with the aid of the rotary member 421, and then the Z-axis slider 420 is lowered. With this operation, the reticle R2 is placed on the reticle stage 425, while the reticle R1 is placed on the substrate adsorptive surface of the first reticle holding unit $433_1$. Thereafter, the arms 423A, 423B and the arms 424A, 424B of the rotary arm device 418 are opened.

Subsequently, the cache storage 413 is lowered between the opened arms 423A and 423B during the exposure of the reticle R2, and a height of the substrate support pins 417 reverts to the same as that of the reticle stage 425. After this operation, the multiaxial robot hand 406 takes out a third reticle that is to be exposed next from within the reticle library 404, and this third reticle is prealigned by the locating plate 412A and thereafter placed on the substrate support pins 417 on the standby surface 416a. In this way, as shown in FIG. 9B, the reticles R1 through RN–1 (reticles R1–R7 in the present case) are individually housed in a series of the reticle holding units $433_1$–$433_N$ of the cache storage 413. In this case, the last reticle RN (reticle R8 in the present case) is being exposed on the reticle stage 425 of FIG. 8.

(C) Replacement of the reticle through the cache storage 413.

Thereafter, when effecting an exposure during a second cycle by use of the reticles R1–RN on the reticle stage 425 as well as within the cache storage 413 of FIG. 9B, the reticle is replaced between the cache storage 413 and the reticle stage 425 in the manner which follows. In this case, the reticle that is being exposed on the reticle stage 425 is expressed as a reticle RB. That is, the reticle RB is a certain reticle among the reticles R1–RN.

Figure 10B:
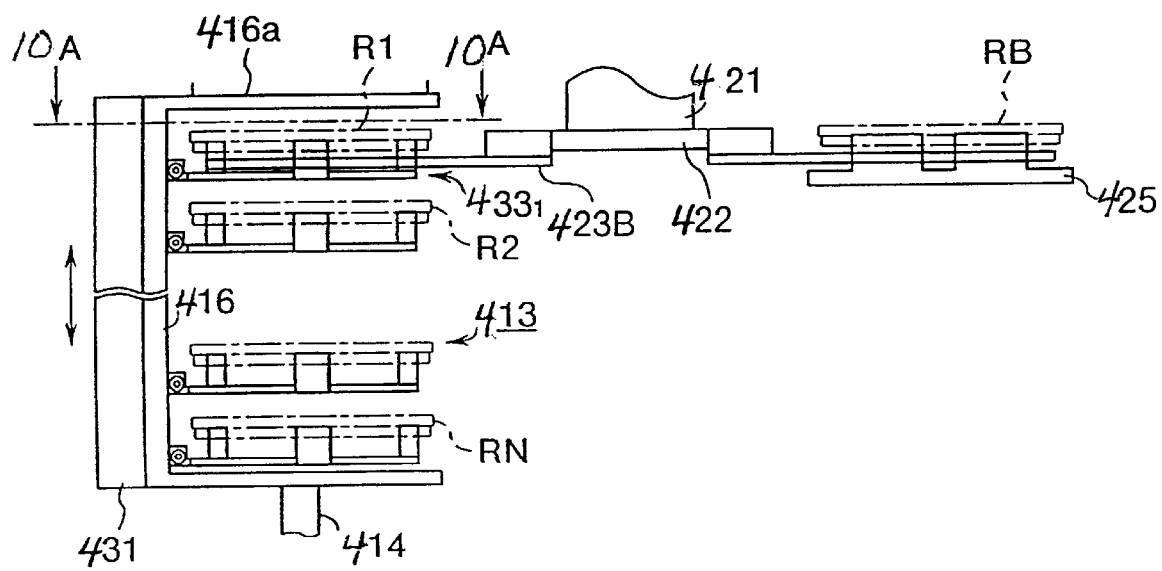
FIG. 10B is a side view of the principal portion but illustrates a state where arms of a rotary arm device 418 are opened in FIG. 8.

FIG. 10B is a side view showing a state where the reticle RB that is being exposed on the reticle stage 425 is placed, and the reticle R1 to be exposed next is housed in the reticle holding unit $433_1$ in the cache storage 413. FIG. 10A is a sectional view taken along the line 10A—10A of FIG. 10B. In this state, the reticle R1 waits till the exposure of the reticle RB is finished. On this occasion, one set of arms 423A, 423B of the rotary arm device 418 wait in a state where the arms are opened under the side surface of the reticle R1, while the other set of arms 424A, 424B thereof wait in the state where the arms are opened under the side surface of the reticle RB.

Figure 11A:
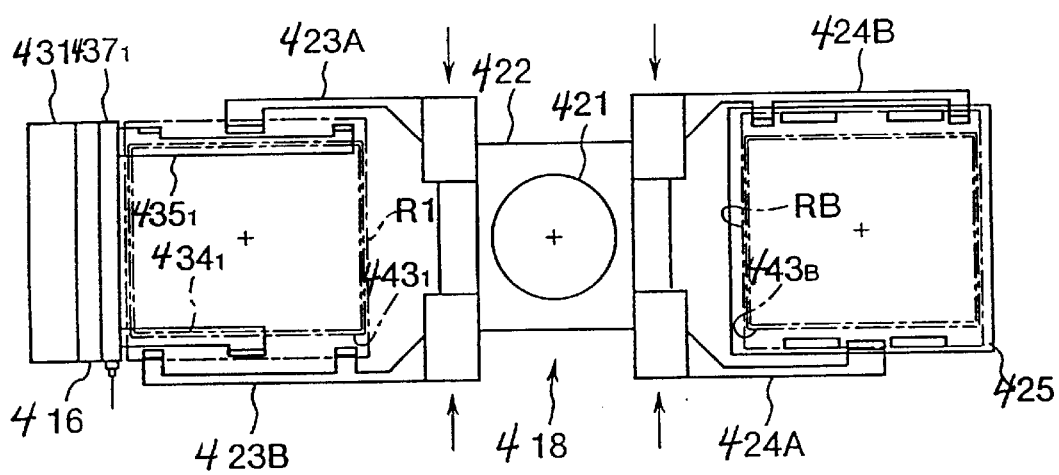
FIG. 11A is a sectional view taken along the line 11A—11A of FIG. 11B.
Figure 11B:
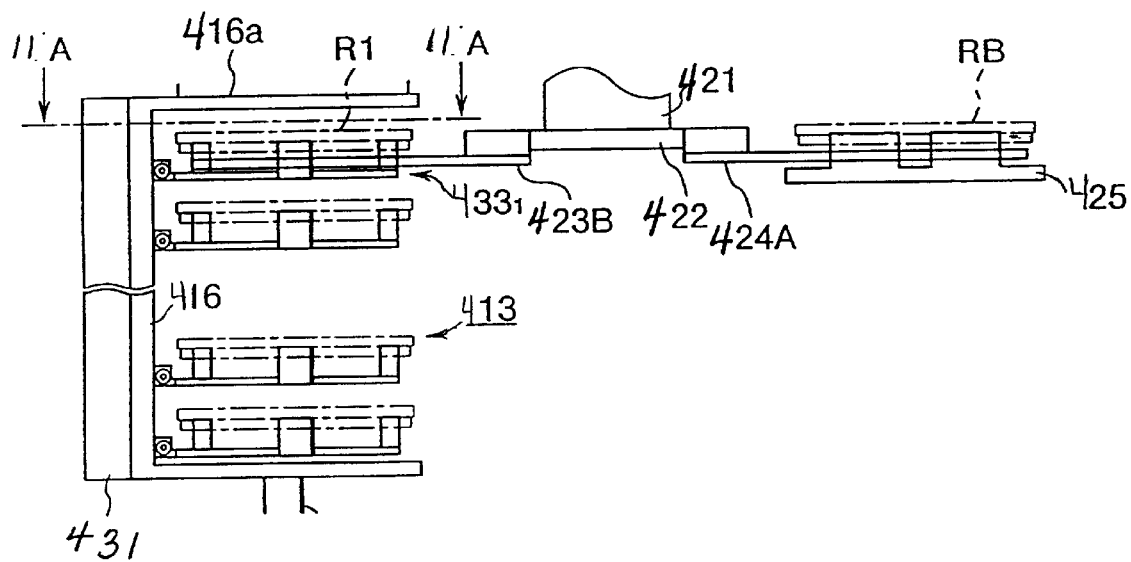
FIG. 11B is a side view of the principal portion but illustrates a state where the arms of the rotary arm device 418 are closed in FIG. 8.

Next, when the exposure using the reticle RB is finished, as illustrated in FIGS. 11A and 11B, the arms 424A, 424B are closed on the side of the lower surface of the reticle RB, while the arms 423A, 423B are closed on the side of the lower surface of the reticle R1. However, the lower surfaces (pattern forming surfaces) of the reticles RB,R1 are respectively fitted with the pellicle frames $443_B$, $443_1$, and hence the individual arms are closed up to positions that are not sufficient to contact these pellicle frames. Thereafter, in a state where the reticles RB,R1 are released from being vacuum-adsorbed in combination with the reticle stage 425 and the reticle holding unit $433_1$, the Z-axis slider 420 (see FIG. 8) of the rotary arm device 418 is slightly raised in the Z-direction, with the result that the arms 423A, 423B lift the reticle R1 in the Z-direction, and simultaneously the arms 424A, 424B lift the reticle RB in the Z-direction.

Figure 12A:
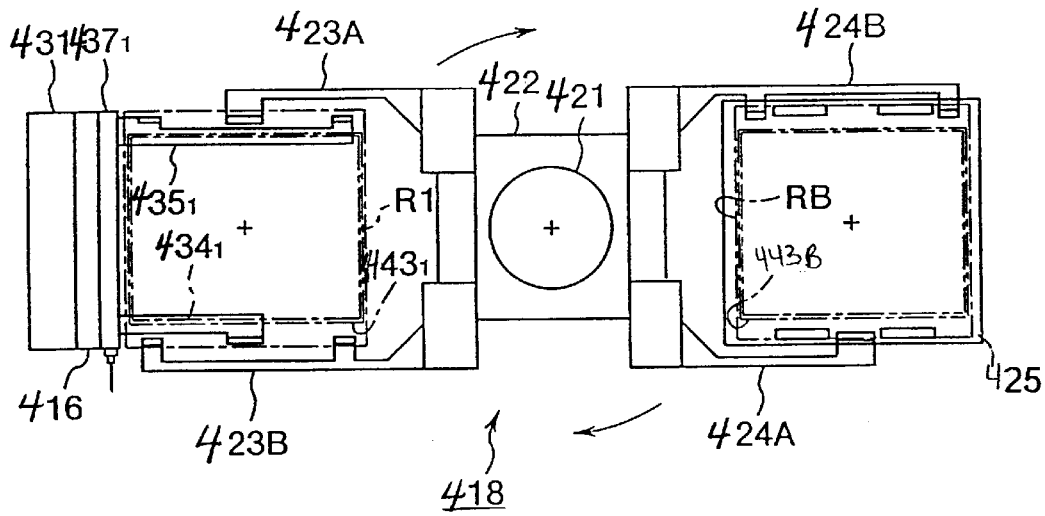
FIG. 12A is a sectional view taken along the line 12A—12A of FIG. 12B.
Figure 12B:
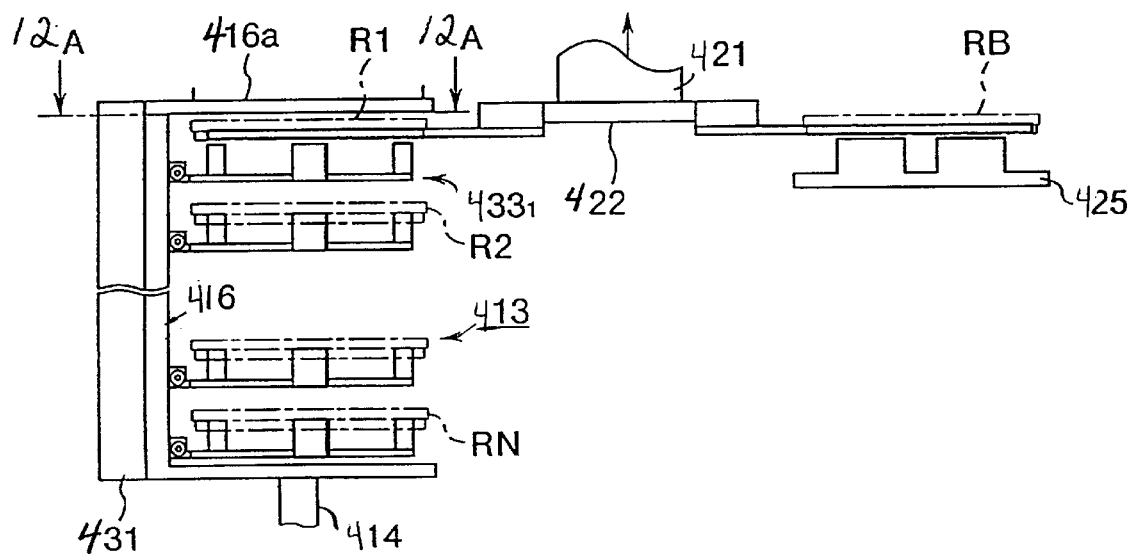
FIG. 12B is a side view of the principal portion but illustrates a state where the arms of the rotary arm device 418 are raised while being closed in FIG. 8.

Then, as illustrated in FIGS. 12A and 12B, the reticle is adsorptively held on the arms 423A, 423B attached to the arm mounting plate 422 of the rotary arm device 418. In this state, the rotary member 421 is rotated through 180°, thereafter the reticle is released from being vacuum-adsorbed, and the Z-axis slider 420 is lowered. With this operation, the reticle RB used for the exposure effected so far is housed in the reticle holding unit $433_1$ within the cache storage 413, while the reticle R1 used for an exposure that will be performed is placed on the reticle stage 425.

Thus, when the reticle is replaced by use of the rotary arm device 418, the moving path of the reticle is substantially the shortest distance, and, therefore, the reticle can be efficiently replaced between the reticle stage 425 and one arbitrary reticle holding unit among the reticle holding units $433_1$–$433_N$, within the cache storage 413. In the examples shown in FIGS. 12A and 12B, however, it follows that the reticle RB is replaced with the reticle R1 by the predetermined reticle holding unit within the cache storage 413. In this situation, housing the reticles determined in one-to-one correspondence with respect to the respective reticle holding units $433_1$–$433_N$, in the cache storage 413 involves rotating the rotary member 421 of the rotary arm device 418 through 90° from the state of FIG. 12A and thereafter setting the height of the cache storage 413 to a position where the reticle RB is housed by moving the Z-axis slider 420 up and down in FIG. 12B. After this operation, the reticle is replaced by further rotating the rotary member 421 through 90°, and, thereafter, the arms 423A, 423B and the arms 424A, 424B may be opened.

According to the substrate transfer apparatus described above, the substrate (reticle, etc.) is transferred between the substrate stage and the cache storage with the rotation of the rotary arm device, and, besides, the position of the substrate in the cache storage is adjusted by the up-and-down movements of the cache storage. Accordingly, the standby position of the substrate becomes substantially the same position with the cache storage, and the transfer path of the substrate is shortened. Hence, this leads to an advantage in which the substrate can be replaced at a high speed.

Further, if the rotary arm device is provided with two pairs of substrate adsorbing members openable and closable along the substrate, and when, for example, the substrate is used on the substrate stage, one pair of substrate adsorbing members are opened to retreat the rotary arm device, thus replacing the substrate on the substrate stage. In this case, the substrate adsorbing members may be merely closed, and therefore, a preparing time for replacing the substrate and a replacing time of the substrate are remarkably reduced.

Further, the substrate taken out of the substrate storage unit is housed into the cache storage, and the substrate is replaced between this cache storage and the substrate stage. On this occasion, the substrate is transferred and received between the substrate stage and the cache storage with the rotation of the rotary arm device, and, besides, the position of the substrate in the cache storage is adjusted by the up-and-down movements of the cache storage. Accordingly, there is the advantage in which the transfer path of the substrate is shortened, and, the substrate can be replaced at the high speed.

Moreover, the substrate storage unit and the substrate transfer unit are placed on the first base, while the cache storage and the substrate stage are mounted on the second base different from the first base. Then, the cache storage is provided with the substrate locating unit for locating the substrate when transferring the substrate from the substrate transfer unit. In this case, vibrations of the substrate transfer unit are hard to be transmitted to the substrate stage, whereby the locating process of the substrate can be performed at a high accuracy. Furthermore, the substrate locating unit is capable of roughly locating the substrate before being placed on the substrate stage.

Provided further is the positional deviation quantity detecting unit for detecting the positional deviation between the first base and the second base. When the positional deviation quantity detected by this positional deviation quantity detecting unit, exceeds the predetermined allowable value, the transfer of the substrate from the substrate transfer unit to the cache storage is stopped. In this case, the substrate undergoing the rough locating (prealignment) is transferred to the cache storage in a state where the positional deviation quantity is lessened. Accordingly, the prealignment process can be omitted on the side of the cache storage, and the replacing speed of the substrate can be further improved.

What is claimed is:

1. A method of manufacturing an exposure apparatus for exposing a pattern on a mask onto a substrate, comprising:

providing a mask stage on which one mask is placed when said pattern on said one mask is exposed onto said substrate;

providing a case storage site at which a mask case housing said one mask is stored;

providing a temporary storage site at which a plurality of masks can be stored;

providing a first transfer device which takes said one mask out of its mask case at said case storage site and transfers said one mask to said temporary storage site;

providing mask holding portions on respective ends of a rotation member, each holding portion being capable of holding a mask; and providing a second transfer device, which includes said rotation member, and which transfers said one mask between said temporary storage site and said mask stage.

2. A method of manufacturing an exposure apparatus according to claim 1, wherein said case storage site is arranged such that a plurality of mask cases housing masks can be stored thereat.

3. A method of manufacturing an exposure apparatus according to claim 2, further comprising:

providing, at said temporary storage site, a suction member for holding a plurality of masks stored at said temporary storage site by suction.

4. A method of manufacturing an exposure apparatus according to claim 3, further comprising:

providing a pre-alignment device which effects prealignment of said one mask before said one mask is transferred to said mask stage by said second transfer device.

5. A method of manufacturing an exposure apparatus according to claim 4, further comprising:

providing an information detector which detects information on said one mask during transfer of said one mask.

6. A method of manufacturing an exposure apparatus according to claim 4, wherein a distance between said mask stage and said temporary storage site is arranged to be shorter than a distance between said mask stage and said case storage site.

7. A method of manufacturing an exposure apparatus according to claim 4, wherein the apparatus is arranged such that said mask stage is moved for scanning the pattern on said one mask when the pattern on said one mask is exposed onto said substrate, such that said one mask is passed from one of said mask holding portions to said mask stage directly, and such that said rotation member is constructed to retreat, after said one mask is passed from said one mask holding portion to the mask stage, to a position at which scanning movement of said mask stage is free of interference from the rotation member.

8. A method of manufacturing an exposure apparatus according to claim 7, wherein a storage member at said temporary storage site is arranged to be movable in up and down directions.

9. A method of manufacturing an exposure apparatus for exposing a pattern on a mask onto a substrate, comprising:

providing a mask stage on which one mask is placed;

providing a case storage site at which a mask case housing said one mask is stored;

providing a temporary storage site at which a plurality of masks can be stored;

providing a first transfer device which takes said one mask out of its mask case at said case storage site and transfers said one mask to said temporary storage site; and providing a second transfer device which transfers said one mask between said temporary storage site and said mask stage.

10. A method of manufacturing an exposure apparatus according to claim 9, wherein said case storage site is arranged such that a plurality of mask cases holding masks are stored thereat.

11. A method of manufacturing an exposure apparatus according to claim 10, further comprising:

providing, at said temporary storage site, a suction member for holding the plurality of masks stored at said temporary storage site by suction.

12. A method of manufacturing an exposure apparatus according to claim 11, further comprising:

providing a pre-alignment device which effects prealignment of said one mask before the said one mask is transferred to said mask stage by said second transfer device.

13. A method of manufacturing an exposure apparatus according to claim 12, wherein a distance between said mask stage and said temporary storage site is arranged to be shorter than a distance between said mask stage and said case storage site.

14. A method of exposure for exposing a pattern on a mask onto a substrate, comprising:

storing a mask case in which one mask is housed, at a case storage site;

taking said one mask out of its mask case stored at the case storage site;

transferring, by means of a first transfer device, said one mask taken out of it mask case to a temporary storage site at which a plurality of masks can be stored;

transferring, by means of a second transfer device, said one mask between said temporary storage site and a mask stage which holds said one mask at a position at which said one mask is subjected to exposure, said second transfer device including a rotation member having mask holding portions at respective ends thereof, each of which is capable of holding a mask; and exposing a pattern of said one mask on said stage onto a substrate.

15. An exposure method according to claim 14, wherein a plurality of mask cases are stored at said case storage site, and a plurality of masks are transferred between said temporary storage site and said mask stage by said second transfer device including the rotation member.

16. An exposure method according to claim 15, further comprising:

holding said one mask transferred to said temporary storage site by suction with a suction member provided at said temporary storage site, after said one mask taken out of its mask case is transferred to said temporary storage site.

17. An exposure method according to claim 16, further comprising:

effecting pre-alignment of said one mask before said one mask is transferred to said stage.

18. An exposure method according to claim 17, further comprising:

detecting information on said one mask during the transfer of said one mask.

19. An exposure method according to claim 17, wherein said exposure method is a scanning exposure method in which upon exposing a pattern on said one mask onto said substrate, said mask stage is moved so that said one mask and said substrate are relatively scanned, said one mask is placed onto said mask stage directly from one of said mask holding portions of the rotation member of the second transfer device, and said rotation member retreats to a position at which scanning of said mask stage is free of interference from the rotation member after said one mask is placed on said mask stage by means of said rotation member.

20. An exposure method for exposing a pattern on a mask onto a substrate, comprising:

storing a mask case in which one mask is housed, at a case storage site;

taking said one mask out of its mask case stored at the case storage site;

transferring, by means of a first transfer device, said one mask taken out of its mask case to a temporary storage site at which a plurality of masks can be stored;

transferring said one mask between said temporary storage site and a mask stage which holds said one mask at a position at which said one mask is subjected to exposure; and exposing a pattern of said one mask transferred to said stage onto a substrate.

21. An exposure method according to claim 20, wherein a plurality of mask cases are stored at said case storage site and a plurality of masks are transferred between said temporary storage site and said mask stage by means of a transfer device including a rotation member.

22. An exposure method according to claim 21, further comprising:

holding said one mask transferred to said temporary storage site by suction with a suction member provided at said temporary storage site, after said one mask taken out of its mask case is transferred to said temporary storage site.

23. An exposure method according to claim 22, further comprising:

effecting pre-alignment of said one mask before said one mask is transferred to said stage.

24. A method of manufacturing an exposure apparatus for exposing a pattern on a mask onto a substrate, comprising:

providing a mask stage on which one of a plurality of masks is placed;

providing a temporary storage site having a plurality of mask holding positions at which said plurality of masks, respectively, can be held;

providing a first transfer device at a location from which said first transfer device is movable to a plurality of positions corresponding to said plurality of mask holding positions, respectively, and that transfers said one mask to one of said plurality of mask holding positions of said temporary storage site at which a mask is not held; and providing a second transfer device at a location from which said second transfer device is movable to a plurality of positions corresponding to said plurality of mask holding positions, respectively, and that transfers said one mask between said temporary storage site and said mask stage.

25. A method of manufacturing an exposure apparatus according to claim 24, further comprising:

providing a case storage site at which mask cases holding said plurality of masks, respectively, can be stored.

26. An exposure method for exposing a pattern on a mask onto a substrate, comprising:

transferring one of a plurality of masks to a temporary storage site having a plurality of mask holding positions at which said plurality of masks, respectively, can be held, by means of a first transfer device movable to a plurality of positions corresponding to said plurality of mask holding positions, respectively;

transferring said one mask between said temporary storage site and a mask stage that holds said one mask at a position at which said one mask is subjected to exposure, by means of a second transfer device movable to a plurality of positions corresponding to said plurality of mask holding positions, respectively; and exposing a pattern of said one mask transferred to said stage onto a substrate.

27. An exposure method according to claim 26, wherein the plurality of masks are transferred between said temporary storage site and said mask stage by means of said second transfer device, that includes a rotation member.

28. An exposure apparatus for exposing a pattern on a mask onto a substrate, comprising:

a mask stage on which one of a plurality of masks is placed;

a temporary storage site having a plurality of mask holding positions at which said plurality of masks, respectively, can be held;

a first transfer device at a location from which said first transfer device is movable to a plurality of positions corresponding to said plurality of mask holding positions, respectively, and that transfers said one mask to one of said plurality of mask holding positions of said temporary storage site at which a mask is not held; and a second transfer device at a location from which said second transfer device is movable to a plurality of positions corresponding to said plurality of mask holding positions, respectively, and that transfers said one mask between said temporary storage site and said mask stage.

29. An exposure apparatus according to claim 28, further comprising:

a suction member at said temporary storage site that holds masks stored at said temporary storage site by suction.

30. An exposure apparatus according to claim 28, further comprising:

a pre-alignment device that effects pre-alignment of said one mask before said one mask is transferred to said mask stage by said second transfer device.

31. An exposure apparatus for translating a pattern on a mask onto an object, comprising:

a mask stage on which one of a plurality of masks is held for use in said translating;

a transferring system that receives said one mask at a delivering position in said exposure apparatus and that has a predetermined route between said delivering position and said mask stage, wherein said transferring system transfers said one mask by moving it along said predetermined route; and a mask storage site at a location accessible from said predetermined route by said transferring system, said mask storage site having a plurality of mask holding positions at which said plurality of masks, respectively, can be held imultaneously, wherein said transferring system transfers a mask from one of said mask holding positions of the mask storage site to said mask stage using a part of said predetermined route.

32. An exposure apparatus according to claim 31, further comprising:

an air supply device that supplies clean air for masks held at said mask holding positions of the mask storage site.

33. An exposure apparatus according to claim 32, wherein said air supply device includes a cleaning filter.

34. An exposure apparatus according to claim 31, further comprising:

a suction device at each of said mask holding positions to hold the respective masks at said mask holding positions.

35. An exposure apparatus according to claim 31, further comprising:

a pre-alignment device that pre-aligns a mask transferred by said transferring system before that mask is transferred to said mask stage.

36. An exposure apparatus according to claim 31, wherein transferred masks are provided with bar codes and said apparatus further comprises:

a bar code reader located near said predetermined route that detects information from said bar codes.

37. A method for translating a pattern provided on a mask onto an object using an exposure apparatus, comprising:

delivering one of a plurality of masks to a first position in said exposure apparatus;

transferring said one mask from said first position to a different second position along a predetermined route, said second position corresponding to an exposure position where said one mask is used for said pattern translating;

storing said one mask temporarily at a mask storage site having a plurality of mask holding positions at which said plurality of masks, respectively, can be held simultaneously; and transferring said one mask between said mask storage site and said second position.

38. A method according to claim 37, further comprising:

supplying clean air for masks held at said mask holding positions of said mask storage site.

39. A method according to claim 37, further comprising:

holding masks stored at said mask storage site with a suction device at each mask holding position.

40. A method according to claim 37, further comprising:

pre-aligning said one mask transferred from said first position or transferred from said mask storage site.

41. A method according to claim 37, further comprising:

performing second pattern translating using a second mask transferred after first pattern translating has been completed using said one mask; and performing third pattern translating using said second mask after said second pattern translating has been completed, and then performing fourth pattern translating using said one mask.

* * * * *